United States Patent
Song et al.

(10) Patent No.: US 12,284,300 B2
(45) Date of Patent: *Apr. 22, 2025

(54) MOBILE TERMINAL

(71) Applicant: LG ELECTRONICS INC., Seoul (KR)

(72) Inventors: Insu Song, Seoul (KR); Jaewook Kim, Seoul (KR); Seongcheol Lee, Seoul (KR); Minsoo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 180 days.

This patent is subject to a terminal disclaimer.

(21) Appl. No.: 17/904,725

(22) PCT Filed: Feb. 20, 2020

(86) PCT No.: PCT/KR2020/095006
§ 371 (c)(1),
(2) Date: Aug. 22, 2022

(87) PCT Pub. No.: WO2021/167236
PCT Pub. Date: Aug. 26, 2021

(65) Prior Publication Data
US 2023/0075243 A1 Mar. 9, 2023

(51) Int. Cl.
*H04M 1/02* (2006.01)
*G06F 1/16* (2006.01)
(Continued)

(52) U.S. Cl.
CPC ........ *H04M 1/0237* (2013.01); *G06F 1/1652* (2013.01); *H04M 1/0268* (2013.01); *H05K 5/0086* (2013.01); *H05K 5/0217* (2013.01)

(58) Field of Classification Search
CPC ............. H04M 1/0237; H04M 1/0268; H04M 2201/08; G06F 1/1652; G06F 1/1624;
(Continued)

(56) References Cited

U.S. PATENT DOCUMENTS 10,904,371 B1 * 1/2021 Song ................. G06F 1/1656
2017/0060183 A1 * 3/2017 Zhang ................ G06F 1/1615
(Continued)

FOREIGN PATENT DOCUMENTS

CN 102280077 A * 12/2011
KR 20130010676 A * 1/2013 ............. A47H 15/02
(Continued)

OTHER PUBLICATIONS

European Patent Office Application Serial No. 23185193.2, Search Report dated Nov. 30, 2023, 8 pages.
(Continued)

*Primary Examiner* — Abhishek M Rathod
*Assistant Examiner* — Keon Kim
(74) *Attorney, Agent, or Firm* — LEE, HONG, DEGERMAN, KANG & WAIMEY

(57) ABSTRACT

Disclosed herein is a mobile terminal including a first frame, a second frame, a slide frame movable with respect to the second frame in a first direction or a second direction, a flexible display including a third region bent to surround the second frame, and a rolling plate attached to a rear of the flexible display. The second frame includes a side portion at an end thereof facing in a third direction perpendicular to the first direction, and a slide rail formed on the side portion. The rolling plate includes a plurality of support bars extending in the third direction and arranged in the first direction, and a slide hook protruding from an end of each of the support bars and movably inserted into the slide rail. The terminal may maintain the display in a flat state by preventing the display from being separated when the second frame is moved.

17 Claims, 16 Drawing Sheets

(51) Int. Cl.
*H05K 5/00* (2006.01)
*H05K 5/02* (2006.01)

(58) Field of Classification Search
CPC .. G06F 1/1681; H05K 5/0086; H05K 5/0217;
G09F 9/301
See application file for complete search history.

(56) References Cited

U.S. PATENT DOCUMENTS

| | | |
|---|---|---|
| 2017/0294495 A1* | 10/2017 | Shyu ...................... H10K 59/35 |
| 2018/0014417 A1 | 1/2018 | Seo et al. |
| 2019/0132432 A1* | 5/2019 | Park ...................... G06F 1/1652 |
| 2019/0268455 A1 | 8/2019 | Baek et al. |
| 2020/0286409 A1* | 9/2020 | Li ......................... G09F 11/325 |
| 2021/0044683 A1* | 2/2021 | He ......................... G06F 1/1652 |

FOREIGN PATENT DOCUMENTS

| | | | | |
|---|---|---|---|---|
| KR | 10-2016-0141255 | | 12/2016 | |
| KR | 20160141255 A | * | 12/2016 | .............. G09F 9/30 |
| KR | 10-2017-0116551 | | 10/2017 | |
| KR | 10-2019-0113128 | | 10/2019 | |
| KR | 10-2019-0115888 | | 10/2019 | |
| WO | 2019-153818 | | 8/2019 | |

OTHER PUBLICATIONS

PCT International Application No. PCT/KR2020/095006, International Search Report dated Nov. 20, 2020, 8 pages.

* cited by examiner

FIG. 6
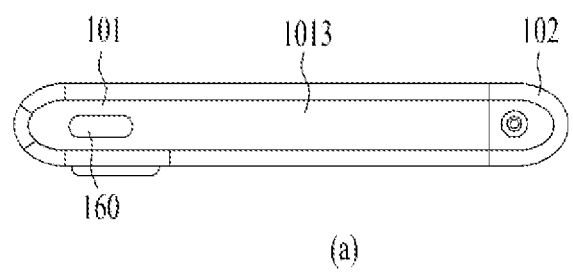
(a)
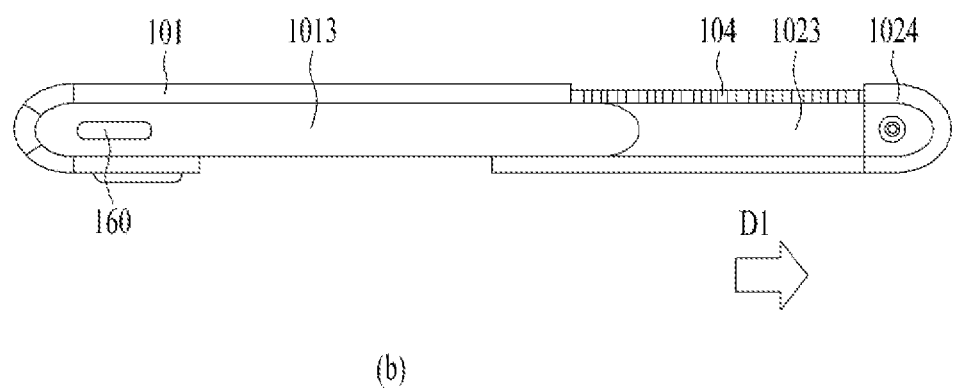
(b)

FIG. 7
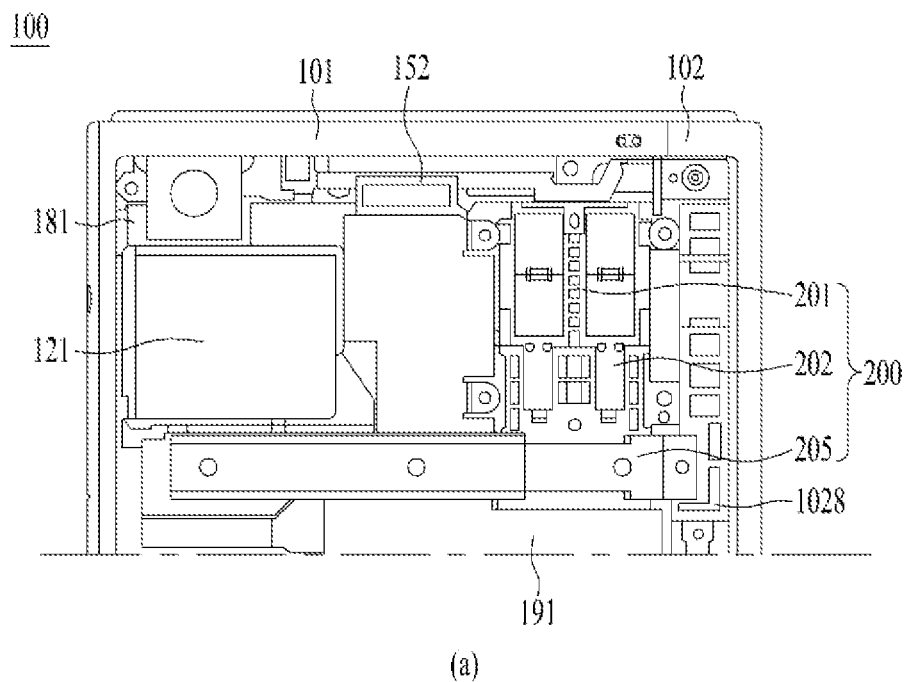
(a)
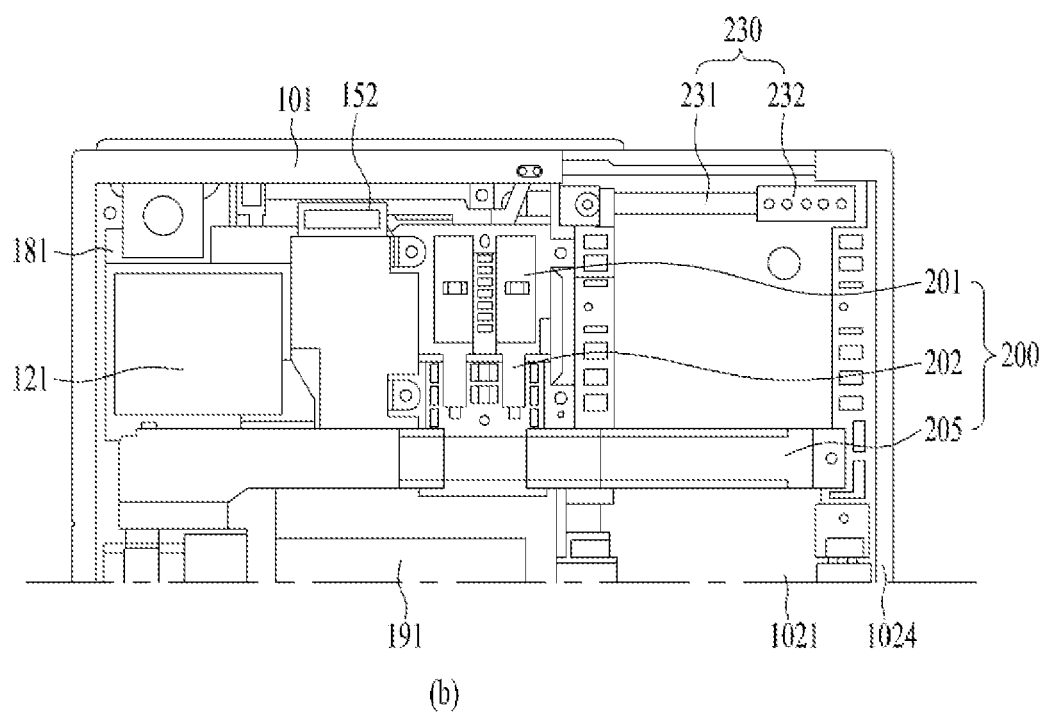
(b)

FIG. 8
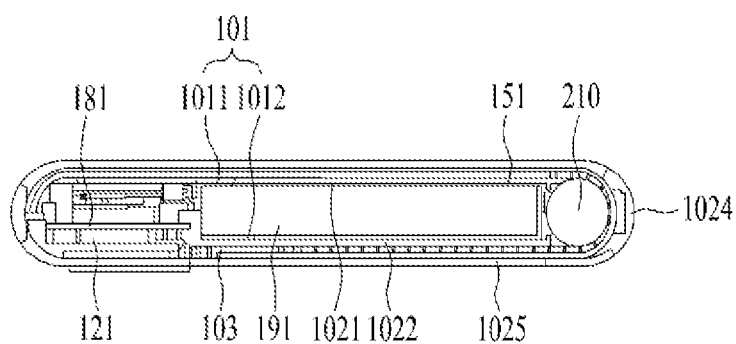
(a)
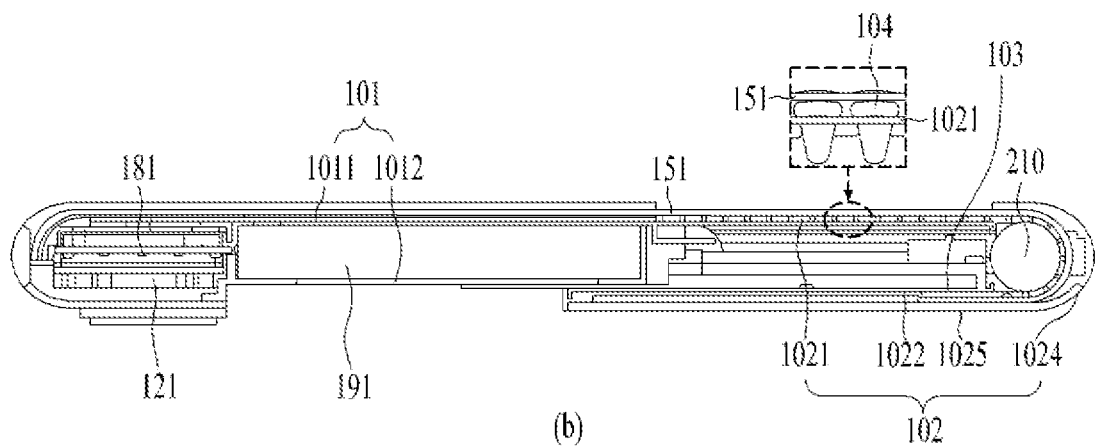
(b)

FIG. 10
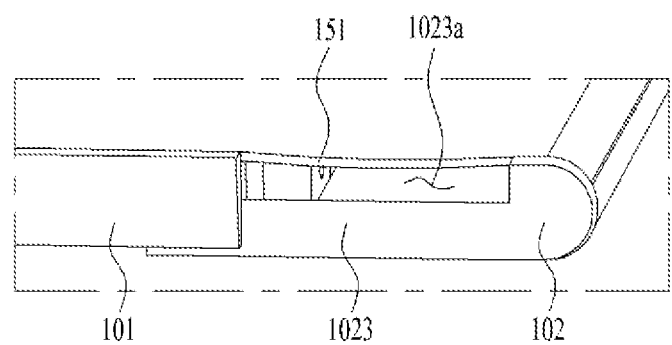
(a)
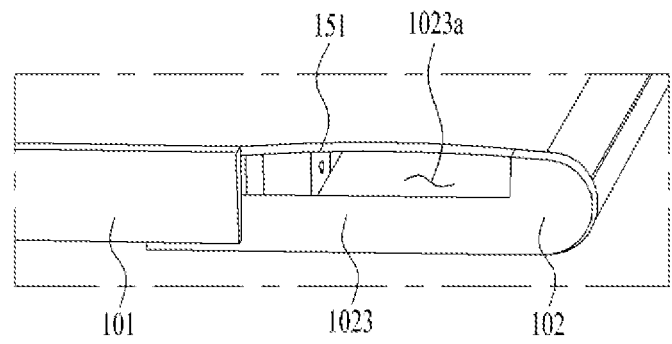
(b)

FIG. 12
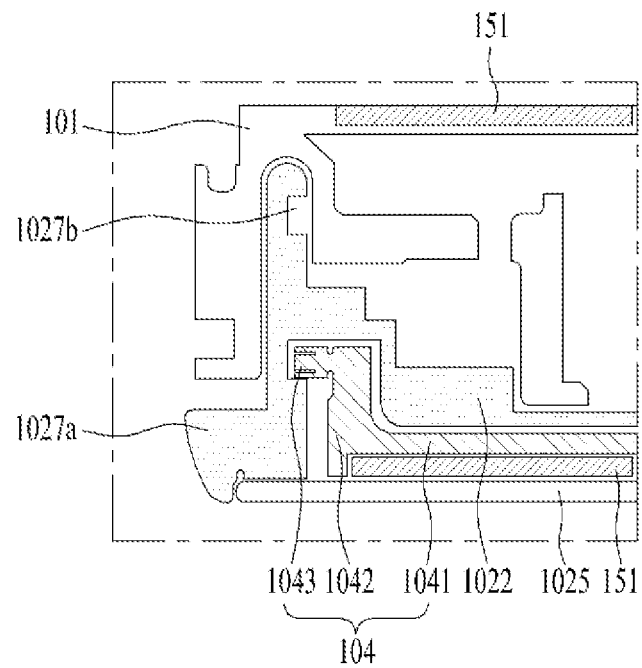
(a)
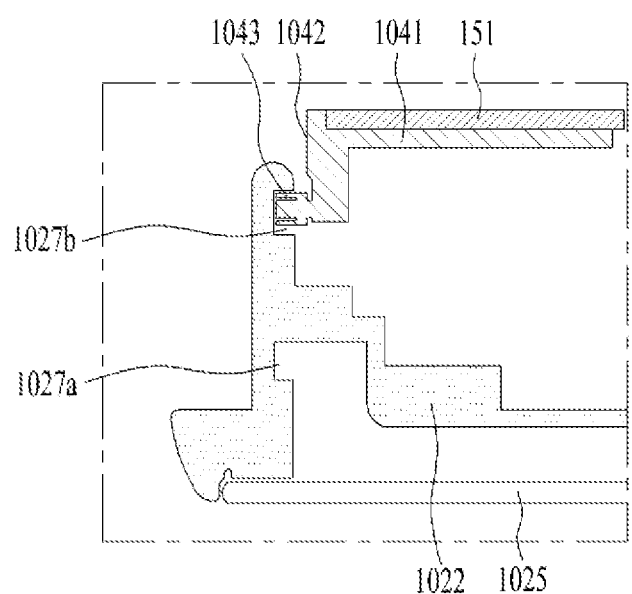
(b)

FIG. 13
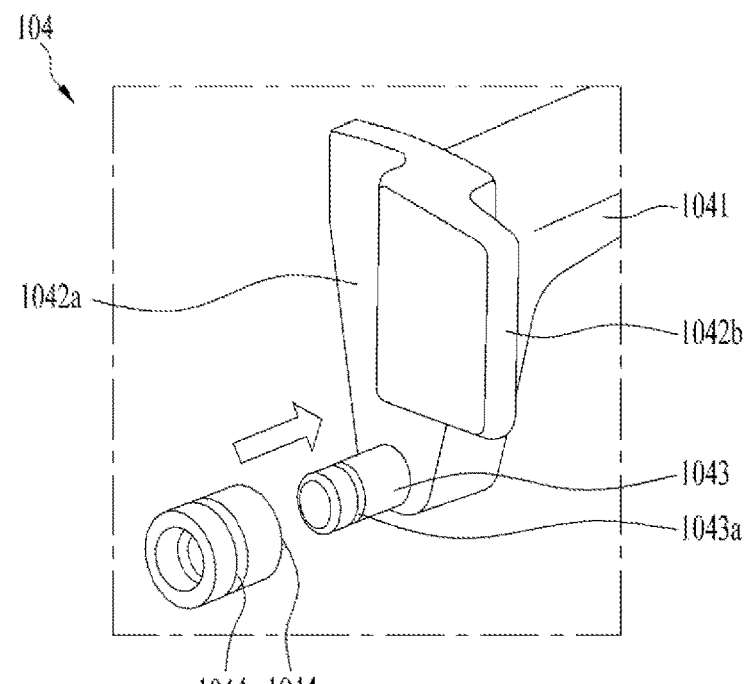
(a)
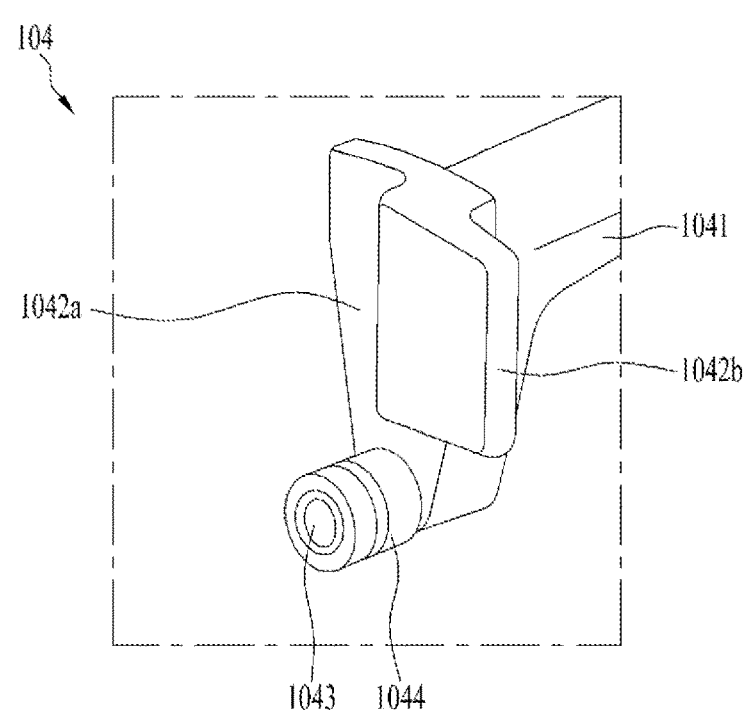
(b)

FIG. 14
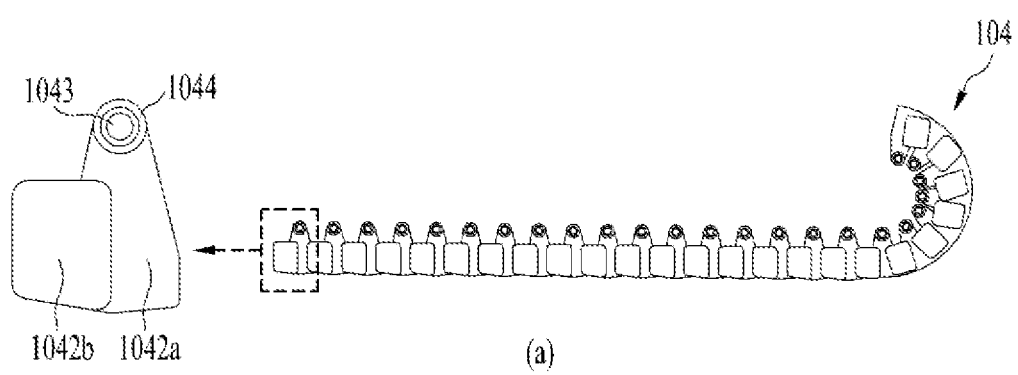
(a)
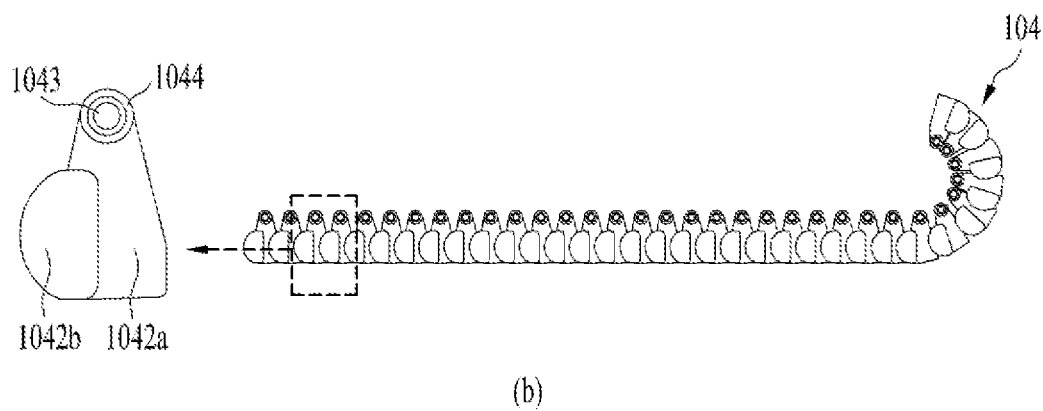
(b)

FIG. 15
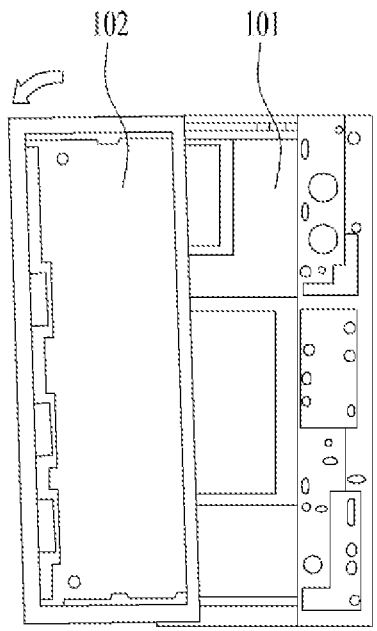
(a)
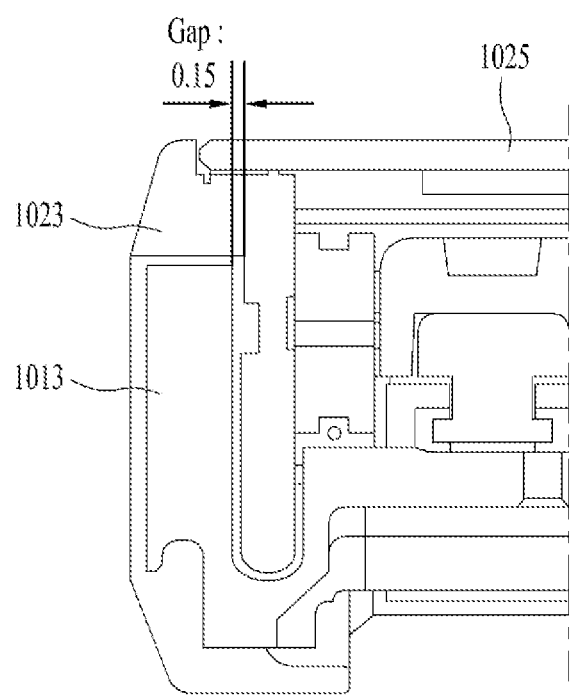
(b)

FIG. 16
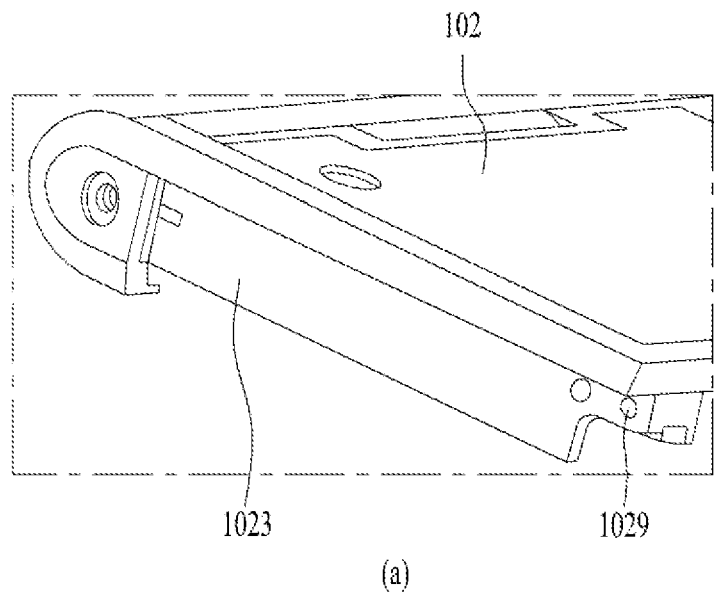
(a)
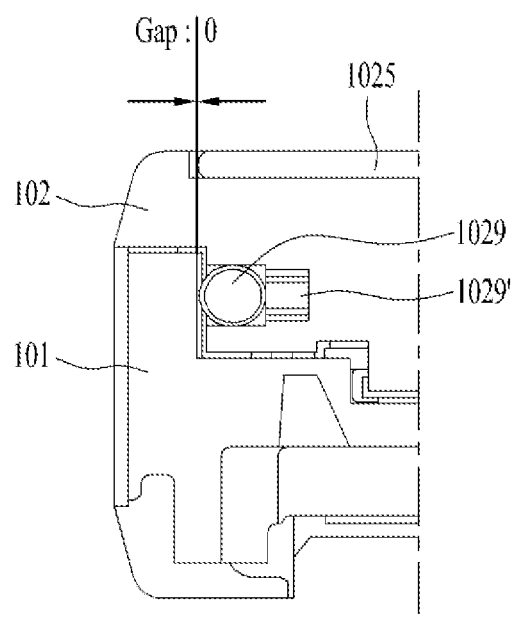
(b)

MOBILE TERMINAL

CROSS-REFERENCE TO RELATED APPLICATIONS

This application is the National Stage filing under 35 U.S.C. 371 of International Application No. PCT/KR2020/095006, filed on Feb. 20, 2020, the contents of which is hereby incorporated by reference herein in its entirety.

TECHNICAL FIELD

The present disclosure relates to a mobile terminal, and more particularly, to a mobile terminal that has a flexible display and is capable of extending a size of a screen while the display is scrolled and slid at the same time.

BACKGROUND ART

Terminals may be generally classified as mobile/portable terminals or stationary terminals according to their mobility. Mobile terminals may also be classified as handheld terminals or vehicle mounted terminals according to whether or not a user can directly carry the terminal.

A display device is a device having a function of receiving, processing, and displaying a video that a user may watch. For example, the display device receives a broadcast selected by the user from broadcast signals transmitted from a broadcasting station, separates a video signal from the received signals, and displays the separated video signal on a display.

In recent years, because of a development of a broadcasting technology and a network technology, functions of the display device have also been considerably diversified, and a performance of the device has been improved accordingly. That is, the display device has been developed to provide not only broadcast contents but also various other contents to the user. For example, the display device may provide game play, music listening, internet shopping, user customized information, and the like using various applications as well as programs received from the broadcasting station. In order to perform such extended functions, the display device may be basically connected to other devices or networks using various communication protocols, and may provide the user with a ubiquitous computing environment. In other words, the display device has evolved into a smart device that enables connectivity to a network and continuous computing.

Recently, a flexible display having sufficient elasticity and capable of large deformation has been developed. The size of a mobile terminal can be varied using the deformable nature of the flexible display. For the mobile terminal having such a variable structure, changing the size of the mobile terminal should be stably performed, and there is a need for a structure to support the extended display unit to maintain a flat state of the display unit.

DISCLOSURE

Technical Problem

One purpose of the present disclosure is to provide a mobile terminal that may improve durability of a flexible display unit by not restricting a point where the flexible display unit is bent to a specific position.

Another purpose of the present disclosure is to provide a mobile terminal including a support structure of a flexible display unit that may stably support the flexible display unit when the flexible display unit is extended.

Another purpose of the present disclosure is to prevent a flexible display unit from being damaged by an external impact on a side where the flexible display unit is bent.

Technical Solution

To achieve these objects and other advantages and in accordance with the purpose of the disclosure, as embodied and broadly described herein, a mobile terminal may include a first frame, a second frame configured to slidably move from the first frame in a first direction or a second direction, the second direction being opposite to the first direction, a slide frame configured to move with respect to the second frame in the first direction or the second direction, a flexible display including a first region coupled to the first frame, a second region coupled to the slide frame, and a third region disposed between the first region and the second region, the third region being bent in a manner of surrounding the second frame, and a rolling plate attached to a rear surface of the flexible display, wherein the second frame may include a side portion positioned at an end thereof facing in a third direction perpendicular to the first direction, and a slide rail formed on the side portion, wherein the rolling plate may include a plurality of support bars extending in the third direction perpendicular to the first direction and arranged side by side in the first direction, and a slide hook protruding from an end of each of the support bars and inserted into the slide rail to move along the slide rail.

The slide hook may have a cylindrical shape.

The mobile terminal may further include a ring-shaped slide roller, the slide roller being inserted into the slide hook.

The mobile terminal may further include a fastening groove formed in a ring shape on an outer circumferential surface of the slide hook, and a fastening protrusion protruding from an inner surface of the slide roller and inserted into the fastening groove.

The mobile terminal may further include an expanded side portion positioned the end of each of the support bars and expanded more than a cross section of the support bars, wherein the expanded side portion may include a first expanded side portion extending from to a position spaced apart from the flexible display and provided with the slide hook.

A width of the first expanded side portion in the first direction may be narrowed as the first expanded side portion extends away from the flexible display.

The expanded side portion may further include a second expanded side portion forming a step with respect to the first expanded side portion, wherein the second expanded side portion may be disposed to overlap the first expanded side portion of a neighboring support bar among the support bars.

The side portion of the second frame may include an opening positioned on a front side, wherein a width of the opening may correspond to a size of the second expanded side portion.

An end portion of the expanded side portion facing the flexible display may include a curved surface.

The mobile terminal may further include a roller coupled to the second frame to be rotatable about a rotation axis extending in the third direction perpendicular to the first direction, wherein the third region may be bent in a manner of surrounding the roller, wherein each of the support bars may include a curved surface corresponding to a curvature of the roller.

The slide rail may include a first horizontal portion positioned adjacent to a rear of the second frame, a second horizontal portion positioned in front of the second frame and arranged parallel to the first horizontal portion, and a curved portion connecting ends of the first horizontal portion and the second horizontal portion facing in the first direction.

The side portion of the second frame may include an opening positioned on a front side of the first horizontal portion, wherein, when the second frame is moved in the first direction to switch from a first state to a second state, an end of the rolling plate facing in the third direction may be exposed to an outside through the opening.

The mobile terminal may further include a rolling ball inserted into the side portion of the second frame, wherein, when the second frame is moved in the first direction or the second direction, the rolling ball may rotate in contact with the first frame.

The rolling ball may contain a metal material. The mobile terminal may further include a magnet provided in an insertion portion of the second frame to apply magnetic force to the rolling ball, the rolling ball being inserted into the second frame.

The rolling plate may further include a rolling sheet having one surface coupled to the flexible display and an opposite surface coupled to the support bars.

The rolling sheet may include a superelastic metal sheet.

The rolling sheet may include a kerf pattern provided with a plurality of grooves extending in the third direction and arranged in the first direction.

The grooves may be positioned between the support bars.

The mobile terminal may further include an adhesive tape positioned between the rolling sheet and the support bars and between the rolling sheet and the display.

The mobile terminal may further include a flexible connector configured to connect the support bars.

Advantageous Effects

The mobile terminal of the present disclosure may allow the size of the screen to be adjusted as needed, thereby satisfying both portability and usability.

In addition, the mobile terminal of the present disclosure may reduce the damage caused by a concentrated stress on the display unit because the stress is not concentrated at a specific point.

In addition, the display unit may be maintained in a flat state by preventing the display unit from being separated during movement of the second frame.

Further, as a structure to guide the second frame and the slide frame to move in parallel is provided, distortion may be prevented.

Further scope of applicability of the present disclosure will become apparent from the detailed description given hereinafter. However, it should be understood that the detailed description and specific examples, while indicating preferred embodiments of the disclosure, are given by illustration only, since various changes and modifications within the spirit and scope of the disclosure will become apparent to those skilled in the art from this detailed description.

DESCRIPTION OF DRAWINGS

FIG. 6 is a side view of the mobile terminal as viewed from a third direction;

FIG. 7 is a view showing a driving unit of the mobile terminal in accordance with an embodiment;

FIG. 8 is a cross-sectional view taken along lines A-A and B-B in FIG. 2;

FIG. 10 is a view illustrating an issue raised in an extendable mobile terminal;

FIG. 12 is a cross-sectional view taken along lines E-E and F-F in FIG. 11;

FIG. 13 is a view showing an expanded side portion and a guide hook of the mobile terminal in accordance with an embodiment;

FIG. 14 is a view showing an embodiment of the rolling plate of the mobile terminal;

FIG. 15 is a view illustrating an issue of distortion and shaking of the first frame and the second frame of the mobile terminal; and FIG. 16 is a view illustrating a mobile terminal to which a rolling ball is applied.

BEST MODE

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
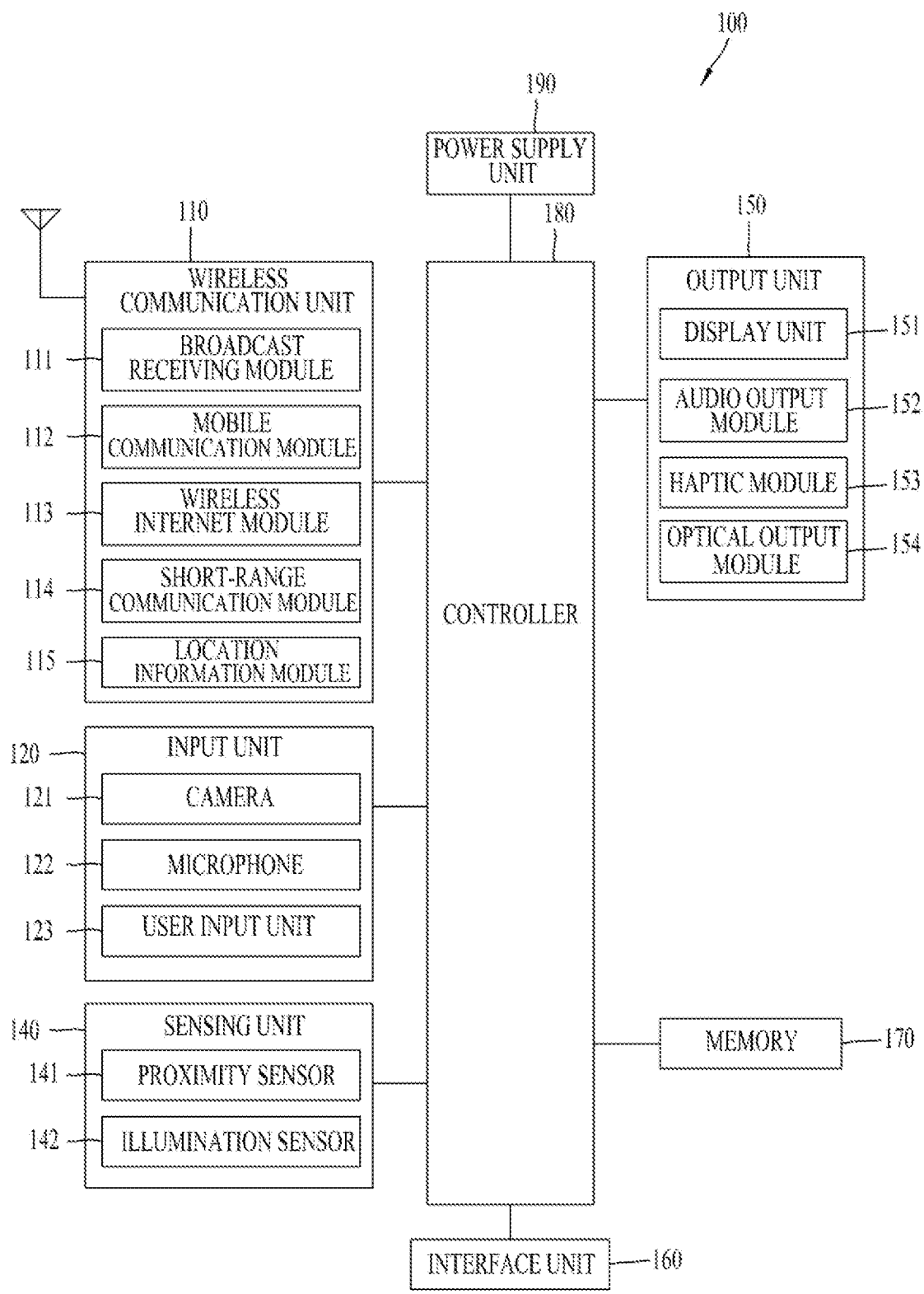
FIG. 1 is a block diagram of a mobile terminal in accordance with the present disclosure.

FIG. 1 is a block diagram of a mobile terminal in accordance with the present disclosure.

The mobile terminal 100 is shown having components such as a wireless communication unit 110, an input unit 120, a sensing unit 140, an output unit 150, an interface unit 160, a memory 170, a controller 180, and a power supply unit 190. Referring now to FIG. 1, the mobile terminal 100 is shown having wireless communication unit 110 configured with several commonly implemented components. It is understood that implementing all of the illustrated components is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideB and (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal. As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Figure 2:
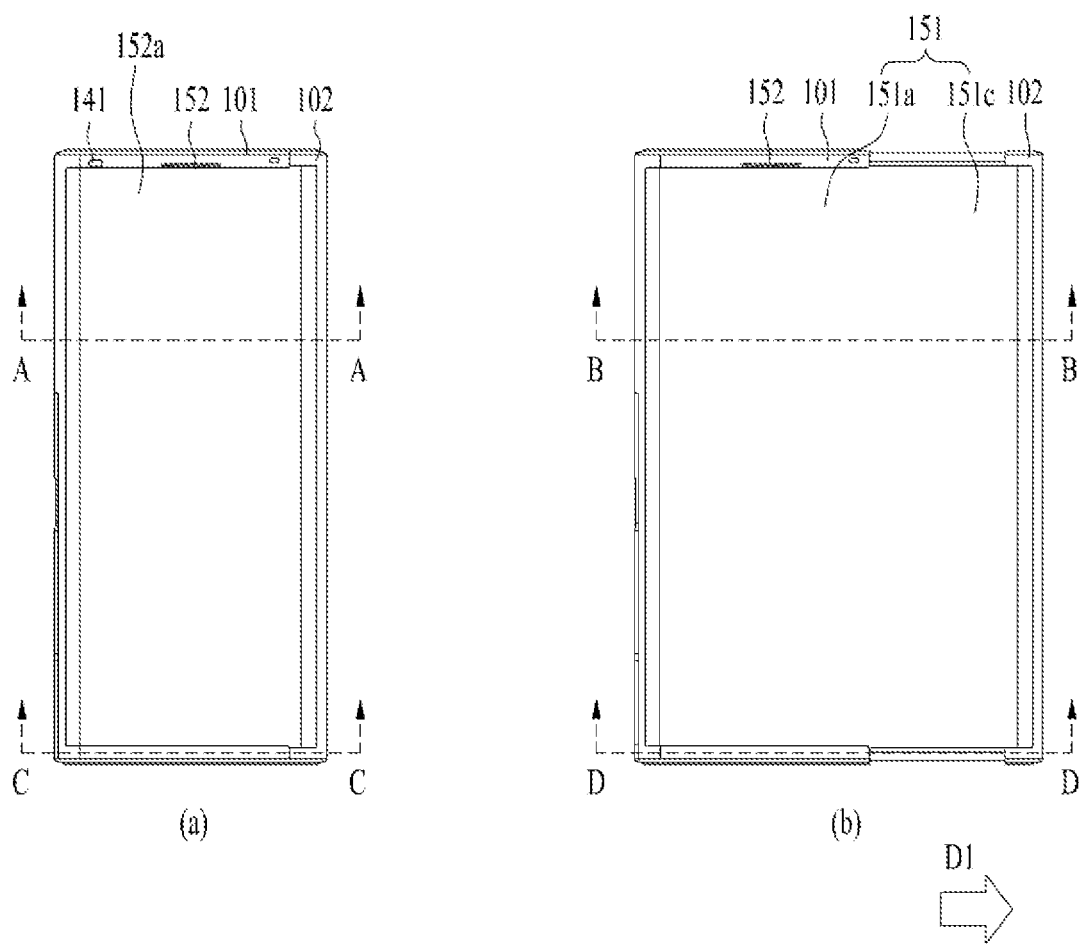
FIG. 2 is a front view of a first state and a second state of the mobile terminal in accordance with an embodiment.
Figure 3:
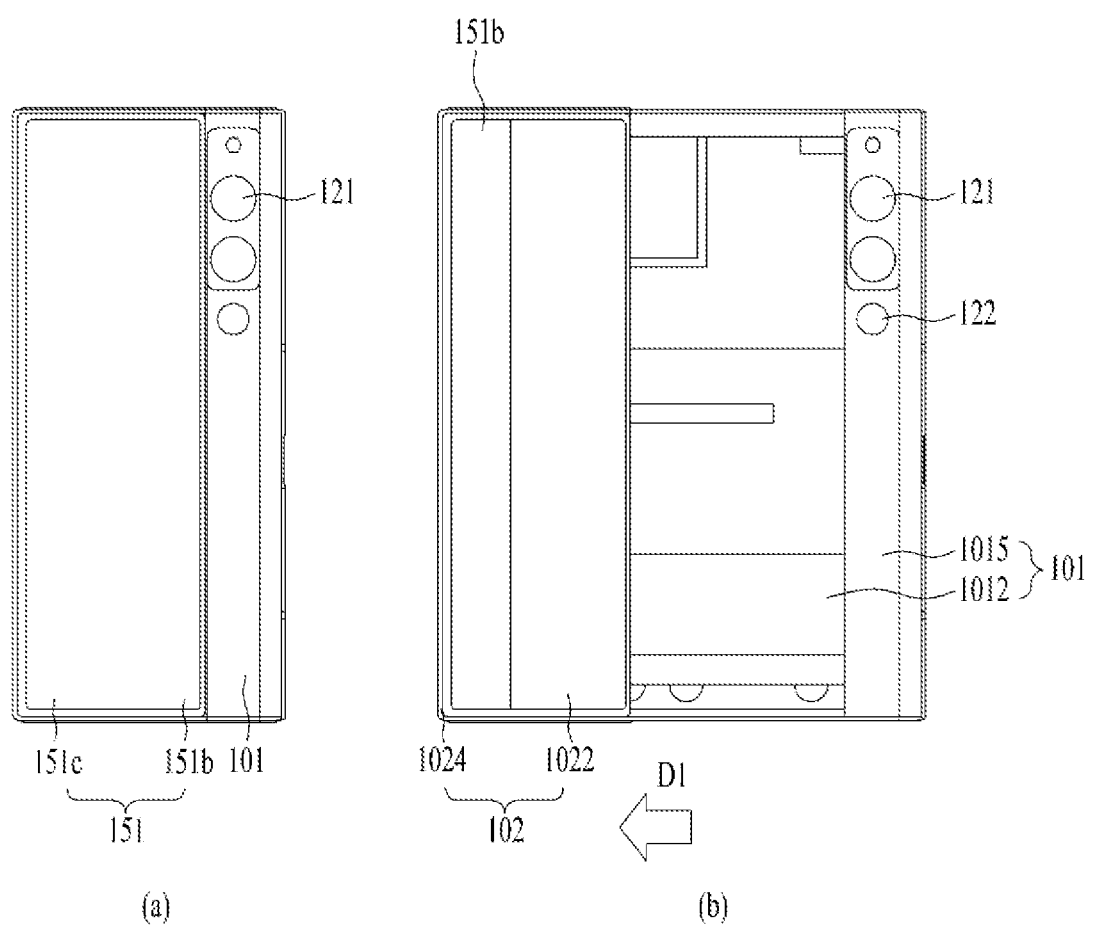
FIG. 3 is a rear view of the first state and the second state of the mobile terminal in accordance with an embodiment.

FIG. 2 is a front view of a first state and a second state of the mobile terminal in accordance with an embodiment, and FIG. 3 is a rear view of the first state and the second state of the mobile terminal in accordance with an embodiment. FIGS. 2(a) and 3(a) are views showing the first state in which the mobile terminal is contracted, and FIGS. 2(b) and 3(b) are views showing the second state in which the mobile terminal is extended.

As shown in the figures, the mobile terminal 100 in the first state is in a contracted position, and has a smaller size than the mobile terminal 100 in the second state. In addition, the size of the display unit 151 positioned on the front of the mobile terminal 100 is also smaller than in the second state. The mobile terminal 100 in the first state may be extended in a first direction D1 to switch to the second state. In the second state, as shown in FIG. 2(b), the size of the mobile terminal 100 and the size of the display unit 151 positioned on the front of the mobile terminal 100 are larger than in the first state, while the size of the display unit 151 positioned on the rear of the mobile terminal 100 is reduced as shown in FIG. 3(b). That is, a part of the display units 151 positioned on the rear of the mobile terminal 151 in the first state moves to the front of the mobile terminal 100 in the second state.

In the following description, the direction in which the mobile terminal 100 and the display unit 151 thereof are extended or enlarged is defined as a first direction D1, and the direction in which the mobile terminal contracts or retracts or is reduced to switch from the second state to the first state is defined as a second direction D2. A direction perpendicular to the first and second directions D1 and D2 is defined as a third direction. Description will be made on the assumption that the first and second directions are horizontal directions and the third direction is a vertical direction. However, depending on the arrangement of the mobile terminal 100, the first and second directions may be vertical directions and the third direction may be a horizontal direction.

As such, a flexible display unit 151 which is bendable may be used as the display unit such that the position of the display unit may be varied. The flexible display unit 151 may be a display unit capable of maintaining a flat state like a conventional flat panel display and capable of warping, bending, folding, twisting, or rolling like paper. The flexible display unit 151 refers to a display which is manufactured on a thin and flexible substrate and is thus lightweight and robust as not to be easily broken. The flexible display unit according the present disclosure may be bent in a specific direction, and may be arranged such that the curvature thereof may change in the first direction.

In addition, an electronic paper is a display technology to which properties of general ink are applied. The electronic paper may be different from the conventional flat panel display in using reflected light. The electronic paper may change information using a twisted ball or electrophoresis using a capsule.

In a state in which the flexible display unit 151 is not deformed (e.g., a state of having an infinite curvature radius, hereinafter referred to as a basic state), a display region of the flexible display unit 151 becomes flat. In a state in which the flexible display unit 151 is deformed by an external force from the basic state (e.g., a state of having a finite radius of curvature, hereinafter referred to as a deformed state), the display region may become a curved face. As shown, information displayed in the deformation state may be visual information output on the curved face. Such visual information is implemented by independently controlling light emission of sub-pixels arranged in a matrix. The sub-pixel refers to a minimum unit for implementing one color. When external force is applied to the flexible display unit 151, the flexible display unit 151 may be deformed to switch from the default state, which is the flat state, to a bent state, which is not the flat state.

The flexible display unit 151 may be combined with a touch sensor to implement a flexible touch screen. When a touch is made on the flexible touch screen, the controller 180 (see FIG. 1) may perform control corresponding to such touch input. The flexible touch screen may be configured to detect the touch input in the deformed state as well as in the basic state.

The touch sensor detects the touch (or touch input) applied on the touch screen using at least one of various touch schemes such as a resistive film scheme, a capacitance scheme, an infrared scheme, an ultrasonic wave scheme, a magnetic field scheme, and the like.

As an example, the touch sensor may be configured to convert a change in pressure applied on a specific portion of the touch screen, capacitance generated at the specific portion, or the like into an electrical input signal. The touch sensor may be configured such that a touch object applying a touch on the touch screen may detect touched position and area on the touch sensor, a pressure during the touch, a capacitance during the touch, and the like.

Further, the mobile terminal 100 may have a deformation detection means for detecting the deformation of the flexible display unit 151. Such deformation detection means may be included in the sensing unit 140 (see FIG. 1).

The deformation detection means may be disposed in the flexible display unit 151 or a case (first to second frames 101 to 102 to be described later) to detect information related to the deformation of the flexible display unit 151. In this connection, the information related to the deformation may include a direction in which the flexible display unit 151 is deformed, a degree of the deformation, a deformed position, a deformed time, an acceleration at which the deformed flexible display unit 151 is restored, and the like. In addition, the information related to the deformation may include various kinds of information that may be detected due to the bending of the flexible display unit 151.

In addition, the controller 180 may change information displayed on the flexible display unit 151 or generate a control signal for controlling a function of the mobile terminal 100 based on the information related to the deformation of the flexible display unit 151 detected by the deformation detection means.

The deformation of the flexible display unit 151 may vary depending on the positions of the first frame 101 and the second frame 102. As shown in FIG. 2, since the bending position on the flexible display unit 151 is determined according to the positions of the first frame and the second frame, the bending deformation position of the flexible display unit 151 and the area thereof positioned on the front may be calculated based on the positions of the first frame 101 and the first frame 102 in place of the deformation detection means of the flexible display unit 151.

The state conversion (first or second state) of the flexible display unit 151, i.e., the size change at the front and rear faces of the mobile terminal 100 of the display unit 151 based on the size change of the mobile terminal 100 may be performed manually by a force applied by the user, but may be not limited to such manual scheme. For example, when the mobile terminal 100 or the flexible display unit 151 is in the first state, the mobile terminal 100 or the flexible display unit 151 may be converted into the second state by the user or an application command without the external force applied by the user. As such, in order for the flexible display unit 151 to be automatically deformed without the external force, the mobile terminal 100 may include a driving unit 200, which will be described later.

The flexible display unit 151 of the present disclosure is bent 180 degrees by rolling around a side portion of the mobile terminal 100 facing in the first direction. Accordingly, based on the side portion of the mobile terminal 100, a part of the flexible display unit 151 is disposed on the front of the mobile terminal 100, and the other part of the flexible display unit 151 is disposed on the rear of the mobile terminal 100. For simplicity, the part of the flexible display unit 151 positioned on the front is called a front face, and the other part of the flexible display unit 151 positioned on the rear is called a rear face. As illustrated in FIG. 2, the mobile terminal may extend in the first direction or contract in the second direction opposite to the first direction. In this case, the area of the flexible display unit 151 positioned on the front changes. That is, the sizes of the front face and the rear face may be changed according to a change in the state of the mobile terminal.

The part of the flexible display unit 151 positioned on the front of the mobile terminal 100 may be immovably fixed to the front surface of the first frame 101, and the other part thereof positioned on the rear of the mobile terminal 100 may be movably arranged on the rear of the mobile terminal 100.

In addition, the flexible display unit 151 may be rolled on or released at the side portion in the first direction of mobile terminal. Accordingly, the rear face of the display unit 151 moves, so that the size of the front face of the display unit 151 may be adjusted. Since the size of the flexible display unit 151 is determined and the flexible display unit 151 is formed of one continuous body, an area of rear face of the display unit 151 decreases as an area of the front face of the display unit 151 increases. Such a display unit 151 may be rolled in a second frame 102, which is movable relative to a first frame 101 to be described later, more correctly, on one of sides of the second frame 102. The display unit 151 may be withdrawn or pulled out from or inserted or pushed into the second frame 102 while being rolled in the second frame 102 along a moving direction of the second frame 102 to adjust the area of the display unit 151 on the front face of the mobile terminal 100. Such operation will be described in more detail below along with other relevant components of the mobile terminal 100.

Typically, an antenna is disposed in the case or the housing of the mobile terminal 100, but a portion where the antenna is installed in the case or the housing may be limited because of the flexible display unit 151 that covers not only the front face of the mobile terminal 100 but also the rear face thereof. For this reason, the antenna may be implemented on the flexible display unit 151. An antenna on display (AOD) is an antenna in which a transparent film is formed by stacking an electrode layer and a dielectric layer that have patterns engraved thereon, respectively. The antenna on display may be implemented thinner than an antenna implemented using a laser direct structuring (LDS) technology using a conventional copper nickel plating scheme, so that the antenna on display may not be exposed to the outside without affecting a thickness. In addition, the antenna on display may transmit and receive a signal directly to or from the display unit 151. Accordingly, the antenna on display may be used in the mobile terminal 100 in which the display unit 151 is located on the both faces of the mobile terminal 100 as in the present disclosure.

Figure 4:
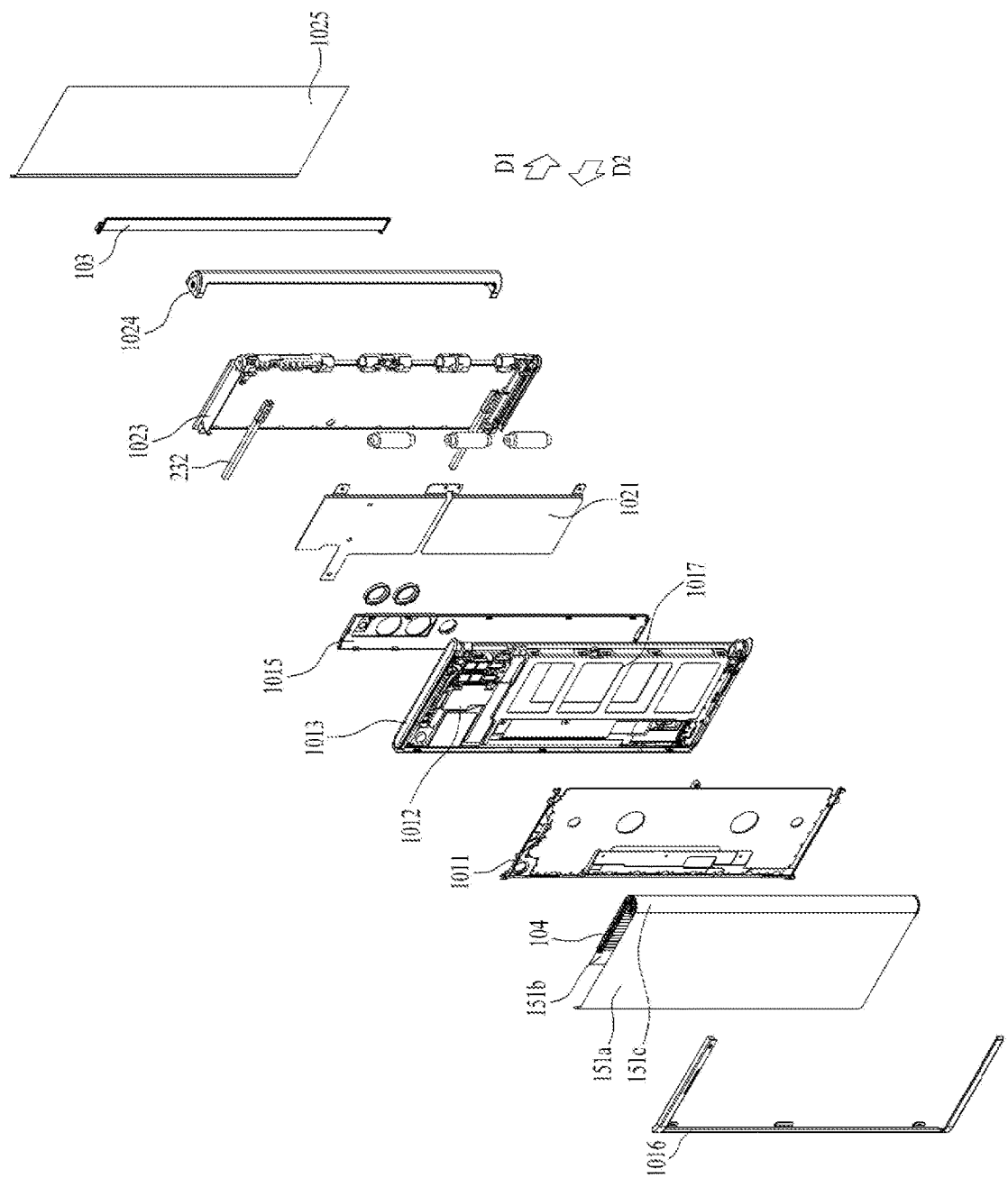
FIGS. 4 and 5 are exploded perspective views of the mobile terminal in accordance with an embodiment.
Figure 5:
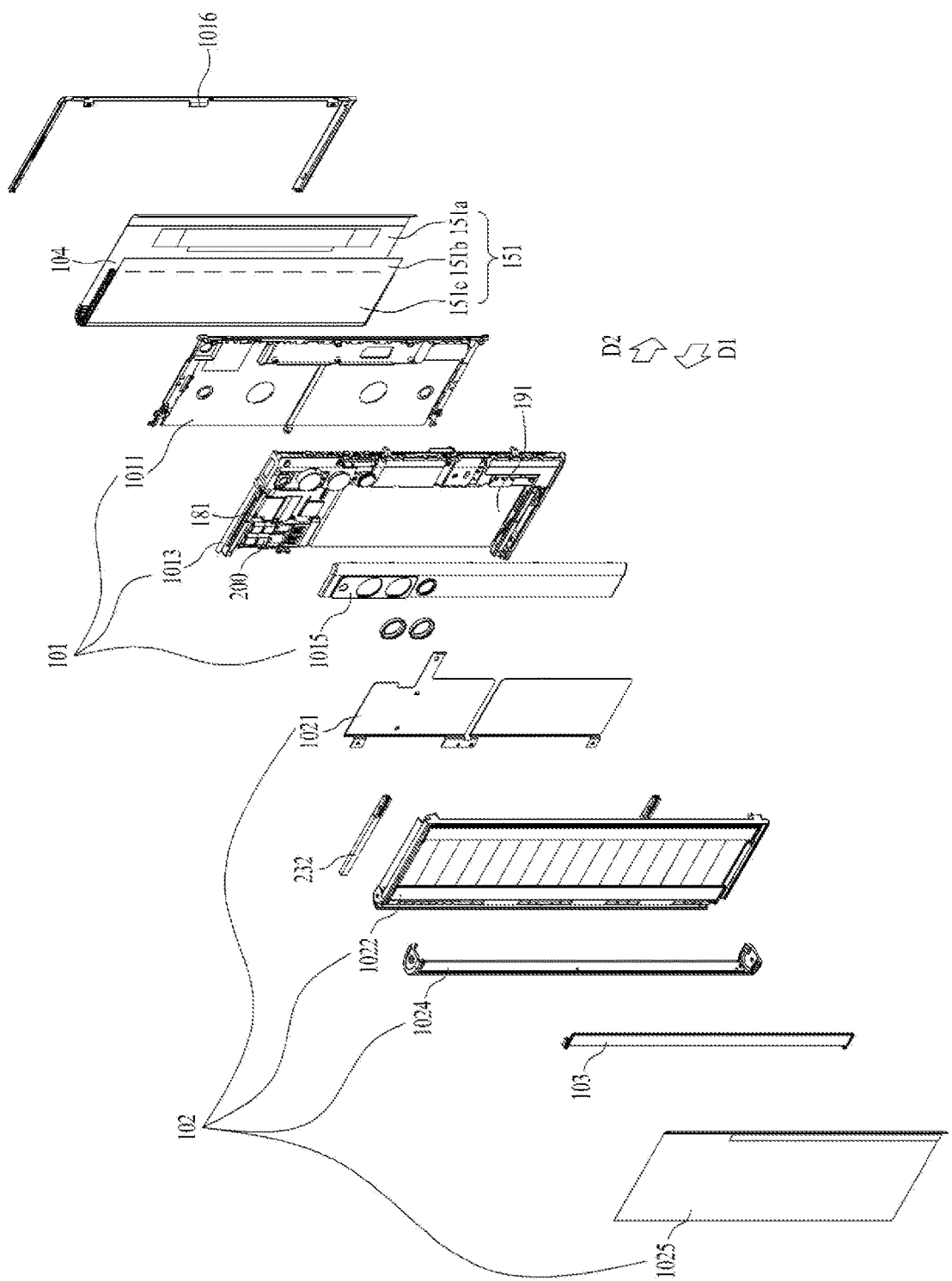

FIGS. 4 and 5 are exploded perspective views of the mobile terminal in accordance with an embodiment. FIG. 4 is an exploded perspective view of the mobile terminal as viewed from the front side, and FIG. 5 is an exploded perspective view of the mobile terminal as viewed from the rear side.

The mobile terminal 100 of the present disclosure includes frames 101 and 102 in which components are mounted, and the frames 101 and 102 of the present disclosure may vary in size in the first direction as shown in FIG. 2. One or more frames 101 and 102 move relative to each other, and sizes thereof may vary in the first direction. Electronic components are mounted in the frames 101 and 102, and the flexible display unit 151 is located out of the frames 101 and 102.

Since the mobile terminal 100 of the present disclosure includes the flexible display unit 151, the flexible display unit 151 may be combined in a form surrounding front faces and rear faces of the frames 101 and 102. The frame may include the first frame 101 and the second frame 102 moving in the first direction with respect to the first frame 101. The first frame 101 and the second frame 102 include front portions, a rear portions, and side portions, respectively, and are coupled to each other.

First, the first frame 101 corresponds to a main body of the mobile terminal 100, and may have a space between the first front portion 1011 and the first rear portion 1012 therein for accommodating various components. In addition, the first frame 101 may accommodate the second frame 102 movably coupled to the first frame 101 in such a space. More specifically, as shown in FIGS. 2 and 5, the first frame 101 may include a first front portion 1011 disposed at a front portion of the mobile terminal 100 and supporting the front face of the display unit 151 and a first rear portion 1012 disposed at a rear portion of the mobile terminal and on which various components are mounted.

The first front portion 1011 and the first rear portion 1012 may be spaced apart from each other at a predetermined spacing to define a predetermined space therebetween, and may be connected to each other by a first side portion 1013. The first side portion 1013 may be integrally formed with the first rear portion 1012 or the first front portion 1011. The camera 121, the audio output module 152, and the input/output terminal, the controller 180, and the power supply unit 190 may be accommodated as components of the mobile terminal 100 in the space in the first frame 101. For example, the controller 180 may be a circuit board 181 including a processor and an electronic circuit for controlling the operation of the mobile terminal, and the power supply unit 190 may be a battery 191 and related components. In addition, the driving unit 200 that controls the slide movement of the second frame 102, which will be described later, may also be accommodated in the first frame 101.

As described above, the display unit 151 has the continuous body, and thus, may be disposed on both the front face and the rear face of the mobile terminal 100 while being rolled in the mobile terminal 100. The display unit 151 may include the front face positioned at the front face of the mobile terminal 100, the rear face positioned at the rear face of the mobile terminal 100, and the side face positioned between the front face and the rear face thereof and surrounding the side face of the mobile terminal. The front face and the rear face of the display unit 151 are flat, and the side face of the display unit 151 may form a curved face. The flexible display unit 151 may be damaged when being bent at an angle. Thus, the flexible display unit 151 may be formed to be bent with a predetermined curvature at the side face.

The display unit 151 may be divided into a fixed portion 151a and 151b and a variable portion 151c. The fixed portion 151a and 151b means a portion fixed to the frame. Because of being fixed to the frame, the fixed portion 151a and 151b maintains a constant shape without changing a bending degree. On the other hand, the variable portion 151c means a portion in which a bending angle or a position of the bent portion changes. The variable portion 151c in which the position or bending angle of the bent portion changes requires a structure for supporting a rear face of the variable portion 151c in response to the change.

The fixed portion 151a, 151b is coupled to the first frame of the display unit and is always positioned on the front face of the display unit to form a portion of the front face of the display unit. The variable portion 151c includes a side face located at a side portion of the mobile terminal, and a position of the side face varies depending on the position of the second frame. Based on a side face, an area of a portion disposed on the front face of the display unit and an area of a portion disposed on the rear face of the display unit vary. That is, a portion of the variable portion 151c may be the front face and another portion of the variable portion 151c may be the rear face based on the first and second states. The variable portion 151c is positioned in the first direction with respect to the fixed portion 151a, 151b relative to the mobile terminal, and an end of the variable portion 151c is bent toward the rear face of the mobile terminal and slides on the rear face of the second frame.

The end of the variable portion of the display unit is coupled with a slide frame that guides the variable portion to slide move on the rear face of the second frame, and the slide frame moves in the first direction at the same time as the second frame moves in the first direction. As a result, a moving distance of the slide frame with respect to the first frame is twice as a moving distance of the second frame with respect to the first frame. Further, as shown in FIG. 3, the first rear portion 1012 of the mobile terminal 100 includes an exposed rear portion 1015 that is exposed to the outside without being covered by the display unit 151 even in the first state. The physical input unit 120 for the manipulation of the mobile terminal 100 such as various buttons, switches, the camera 121, and a flash, and the sensing unit 140 such as the proximity sensor 141 or a fingerprint sensor may be arranged on the exposed rear portion 1015. The first rear portion 1012 except for the exposed rear portion 1015 may be covered by the display unit 151 in the first state as shown in FIG. 3(a), and may be exposed rearward in the second state as shown in FIG. 3(b).

In a conventional bar-shaped terminal, a display unit is provided only on a front face of the terminal. Therefore, a main camera is placed on a rear face of the terminal in order for the user to capture an object at an opposite side while looking through the display unit. On the other hand, an additional auxiliary camera is required to be disposed on the front face of the terminal in order for the user to capture himself or herself while viewing himself or herself through the display unit.

In the mobile terminal 100 of the present disclosure, on the other hand, the display unit 151 is arranged on both the front and rear of the mobile terminal 100. Accordingly, when a user photographs himself, a portion of the display unit 151 positioned on the same surface as the camera 121, that is, the rear face of the display unit 151 may be used. When the user takes a photograph of an object around the user, a portion of the display unit 151 on the side facing away from the camera 121, that is, the front face of the display unit 151 may be used. For this reason, the mobile terminal 100 may take a photograph of the user or an object located around the user using one camera 121. The camera may include a plurality of cameras having different angles of view, such as wide angle, ultra wide angle, and telephoto angle. Not only the camera but also a proximity sensor and an audio output unit may be disposed on the exposed rear portion 1015, and an antenna may be installed on the rear portion 1015. The rear portion 1015 may be used to protect the camera, the sensor, or the like on the exposed rear portion 1015 and not to deteriorate the exterior design. A portion of the rear portion 1015 corresponding to the camera 121 or the sensor 140 may be configured to be transparent, and the other portion thereof may have a predetermined pattern or color in consideration of design aspects without exposing internal parts.

The first side portion 1013 may extend along the edges of the first front portion 1011 and the first rear portion 1012 to surround the circumference of the first frame 101 and may define the appearance of the mobile terminal 100. However, as mentioned above, the second frame 102 is accommodated in and movably coupled to the first frame 101, and therefore a portion of the first frame 101 needs to be open to allow movement of the second frame 102 relative to the first frame 101. As an example, as best shown in FIG. 2, the second frame 102 may be movably coupled to a side of the first frame 101 facing in the first direction, and accordingly the first side portion 1013 may not be formed on the lateral surface facing in the first direction such that the lateral surface is open. Since the first side portion 1013 is exposed to the outside of the mobile terminal 100, the interface unit 160 for connecting a power port or an ear jack or the user input unit 120, such as a volume control button, may be disposed on the first side portion 1013. When the first side portion 1013 contains a metal material, the first side portion 1013 may serve as an antenna.

The second frame 102 may include a second front portion 1021 disposed at the front portion of the mobile terminal 100 and a second rear portion 1022 disposed at the rear portion of the mobile terminal 100. Like the first front portion 1011 and the first rear portion 1012 of the first frame 101, the second front portion 1021 and the second rear portion 1022 may be formed of plate-shaped members that are generally flat. In addition, the second frame 102 also accommodates various components, and must not interfere with the components accommodated in the first frame 101 during the movement. Accordingly, the second front portion 1021 and the second rear portion 1022 may be coupled to each other in a state of being spaced apart from each other to define a predetermined space therebetween, and may have shapes that do not interfere with the components in the first frame 101.

FIG. 6 is a side view of the mobile terminal as viewed from a third direction. FIG. 6 shows the first side portion 1013 of the first frame 101 and a second side portion 1023 of the second frame 102. Since the flexible display unit 151 is positioned at an end of the second frame 102 facing in the first direction, the end of the second frame 102 facing in the first direction should not be exposed to the outside. An end of the second frame 102 facing in the second direction should be open so as not to interfere with the first frame 101. In the first state, the second side portion 1023 of the second frame 102, which is positioned on the side facing in the third direction (which refers to the upward or downward direction in the drawing or may include both the upward and downward directions), may not be exposed to the outside because it overlaps the first side portion 1013 of the first frame. However, in the second state, it may be exposed to the outside because the second frame 102 is drawn out.

In addition, the display unit 151 may be bent 180 degrees while being rolled in the second frame 102 to be disposed on both the front face and the rear face of the mobile terminal 100. For such an arrangement of the display unit 151, the second frame 102 may include a roller 210 rotatably disposed therein. The roller 210 may be disposed at any position inside the second frame 102. However, the display unit 151 should be spread flat on the front face and the rear face of the mobile terminal 100 to provide a good quality screen to the user. Further, for such spread, a proper tension must be provided on the display unit 151. In order to provide the proper tension, the roller 210 may be disposed at a first directional end of the second frame 102. The roller 210 may extend in the third direction, and may be rotatably coupled to the second frame 102.

The display unit 151 may be rolled around the roller 210 while being gently bent with a predetermined curvature. The flexible display unit 151 may include a first face on which a video is output and exposed to the outside and an inner face facing the frame at the opposite side. The roller 210 may be installed to rotate freely in the second frame 102 while being in contact with the inner face of the display unit 151. Accordingly, the roller 210 may actually move the display unit 151 in a lateral direction of the mobile terminal 100, that is, in a direction perpendicular to a longitudinal direction. As will be described later, when the second frame 102 slides, because of the tension applied by the second frame 102, the display unit 151 moves to the front face or the rear face of the mobile terminal 100 in different directions (i.e., the first direction D1 or the second direction D2) relative to the second frame 102. The roller 210 may guide such movement while rotating.

The roller 210 may be disposed adjacent to the end of the second frame 102 that faces in the first direction. A side frame 1024 may be disposed at the end of the second frame 102 facing in the first direction to prevent damage to the display unit 151 rolled around the roller 210.

The side frame 1024 may extend in the longitudinal direction (the third direction) of the second frame 102 to cover the side portion facing in the first direction, thereby protecting the roller 210 and the display unit 151 rolled therearound.

The side frame 1024 may substantially define the appearance of the mobile terminal 100 in cooperation with the first side portion 1013 of the first frame 101. In addition, the side portion of the second frame 102 that faces in the second direction may be omitted to minimize interference with the components arranged in the first frame 101 during movement.

During the expansion and the contraction in such first and second directions D1 and D2, the second frame 102 may overlap the first frame 101, more precisely, the first front portion 1011 and the first rear portion 1012 thereof so as not to interfere with the first frame 101. More specifically, the display unit 151 may be coupled to and supported by the first front portion 1011 of the first frame 101, as described above. Accordingly, the display unit 151 does not need to be additionally supported by the second front portion 1021 of the second frame 102. Rather, when the second front portion 1021 is interposed between the first front portion 1011 and the display unit 151, the display unit 151 may be deformed or damaged because of friction with the second front portion 1021, which is repeatedly moved. Thus, the second front portion 1021 may be disposed below the first front portion 1011, or may be interposed between two first front portions 1011. The second rear portion 1022 of the second frame 102 may be disposed rearward of the first rear portion 1012 of the first frame 101. That is, the front face of the second rear portion 1022 may face the rear face of the first rear portion 1012. In addition, the rear face of the first rear portion 1012 may be in contact with the front face of the second rear portion 1022 to stably support the movement of the second frame 102. Because of such arrangement, the second rear portion 1022 may be exposed to the outside of the first frame, more precisely, of the first rear portion 1012, and may be coupled to the display unit 151.

In addition, the second frame 102 may extend and contract in the first and second directions D1 and D2 to change the size of the mobile terminal 100, particularly, to extend or contract the front face of the mobile terminal 100. Thus, the display unit 151 must move by such extended or reduced front face size to obtain the intended first and second states. However, when being fixed to the second frame 102, the display unit 151 may not be moved smoothly to be adapted for the front face of the mobile terminal 100 that is extended or contracted. For this reason, the display unit 151 may be movably coupled to the second frame 102.

More specifically, the display unit 151 may include a first region 151a disposed on the front of the mobile terminal 100, a second region 151b coupled to a slide frame 103 positioned on the rear of the mobile terminal 100, and a third region 151c located between the first region 151a and the second region 151b and bent around the roller 210. The third region 151c may move to the front or the rear according to change in the state of the mobile terminal 100. The slide frame 103 may be formed of a plate-shaped member extending in the longitudinal direction (the third direction) of the mobile terminal 100, and may be coupled to the second rear portion 1022 so as to be movable in the first and second directions D1 and D2.

The first to third regions 151a, 151b, and 151c may be connected to each other, and may form a continuous body of the display unit 151. In addition, as described above, for the movement of the third region 151c toward the front face or the rear face of the mobile terminal 100 depending on the moving direction of the second frame 102, the first region 151a may be fixed so as not to move to the front face of the mobile terminal 100, and the second region 151b may be provided to be movable on the rear face of the mobile terminal. Such configuration of the display unit 151 will be described in more detail below.

The first region 151a may be disposed on the front face of the mobile terminal 100, more specifically, the first frame 101, that is, on the front face of the first front portion 1011. The first region 151a is fixed to the first frame 101, that is, the front face of the first front portion 1011 so as not to be moved during the movement of the second frame 102, and thus, the first region 151a may always be exposed to the front face of the mobile terminal 100.

The third region 151c may be adjacent to the first region 151a in the first direction and rolled on the roller 210. The third region 151c may partially cover the second frame 102, that is, the rear face of the second rear portion 1022. Further, the second frame 102, that is, the second rear portion 1022, is adjacent to the first frame 101, that is, the first rear portion 1012 and together forms the rear case of the mobile terminal 100. Accordingly, it may be described that the third region 151c is also disposed on the rear face of the first frame 101.

The second region 151b may be adjacent to the third region 151c and may be disposed on the rear face of the mobile terminal 100, more specifically, on the second frame 102, that is, the rear face of the second rear portion 1022 thereof. The second region 151b may be coupled to the slide frame 103 without being directly coupled to the second frame 102.

As a result, the first region 151a may be disposed on the front face of the mobile terminal 100 and may be always exposed to the front face regardless of the movement of the second frame 102, and the second region 151b may be disposed on the rear face of the mobile terminal 100 and may be always exposed to the rear face regardless of the movement of the second frame 102. In addition, the third region 151c may be disposed between the first and second regions 151a and 151b, and may be selectively placed on the front face or the rear face of the mobile terminal 100 depending on the moving directions D1 and D2 of the second frame 102.

Because of such selective placement of the third region 151c, the first rear portion 1012 of the first frame 101 may be exposed to the outside of the mobile terminal 100 because the first rear portion 1012 is covered by the second and third regions 151b and 151c and the second rear portion 1022 of the display unit 151 in the first state, but, in the second state, the third region 151c moves to the front face of the mobile terminal 100 and the second rear portion 1022 also moves in the first direction D1. In addition, the second front portion 1021 of the second frame 102 is hidden by the first front portion 1011 of the first frame 101 in the first state, but, in the second state, moves out of the first frame 101 to support the third region 151c of the display unit 151 disposed on the front face of the mobile terminal 100.

In order to prevent the second front portion 1021 from affecting the internal components during the slide movement, a separating plate 1017 may be further disposed rearward of the second front portion 1021 and fastened with the first front portion 1011. The second front portion 1021 may move between the first front portion 1011 and the separating plate 1017 based on the slide movement of the second frame.

However, the third region 151c may be rolled on the roller 210 and bent in the second frame 102. When converting from the first state to the second state, the third region 151c may extend from the second frame 102 to the front face of the mobile terminal 100 while being rolled on the roller 210 in one direction. On the other hand, when converting from the second state to the first state, the third region 151c may be retracted from the front face of the mobile terminal 100 to the second frame 102 while being rolled on the roller 210 in the opposite direction, and at the same time, may return to the rear face of the mobile terminal 100 from the second frame 102.

A specific location of the foldable mobile terminal in a form of being spread like a book is easily damaged because only the specific location is folded repeatedly. On the other hand, the deformed portion of the flexible display unit 151, that is, a portion rolled on the roller 210, may vary based on the first and second states of the mobile terminal 100, that is, the movement of the second frame 102. Accordingly, the mobile terminal 100 of the present disclosure may significantly reduce deformation and fatigue repeatedly applied to a specific portion of the display unit 151, thereby preventing damage to the display unit 151.

Based on the above-described configuration, overall operations of the mobile terminal 100 will be described as follows. As an example, the state conversion may be performed manually by the user, and an operation of the mobile terminal 100 during such manual state conversion will be described. However, operations of the first to third frames 101 to 103 and the display unit 151, which will be described below, may be performed in the same manner when a power source other than a user's force is used, for example, when the driving unit 200 to be described below is applied.

A rear face cover 1025 may be further disposed on a rear face of the second rear portion 1022 such that the rear face of the display unit positioned on the rear face of the mobile terminal 100 is not exposed to the outside. The rear face of the display unit may be used in the first state when the rear face cover 1025 uses a transparent material, and the rear face of the display unit may be covered such that the movement of the slide frame 103 is not exposed when the rear face cover 1025 uses an opaque material. That is, the second region and the third region of the slide frame 103 and the display unit 151 may move in the first direction and in the second direction in a space between the second rear portion 1022 and the rear face cover 1025.

FIG. 7 is a view showing a driving unit 200 of the mobile terminal 100 in accordance with an embodiment. FIG. 7(a) shows the first state and FIG. 7(b) shows the second state. The mobile terminal 100 of the present disclosure may be switched between the states in a manner in which a user manually pulls the second frame 102 in the first direction D1 or pushes the same in the second direction D2 with respect to the first frame 101. However, in the manual method, applying excessive force to the body of the mobile terminal 100 may damage the mobile terminal 100. Accordingly, a driving unit 200 employing a motor 201 may be further provided to cause the second frame 102 to stably move without distortion.

As the motor 201, a motor 201 configured to provide rotational force as shown in FIG. 7, or a linear motor 201 configured to make linear motion may be used. The motor 201 configured to provide the rotational force should have a large diameter to provide large force. Two motors 201 may be used as shown in FIG. 7 to provide driving force of a predetermined magnitude or more in the limited space of the mobile terminal 100 without increasing the thickness.

If the second frame 102 is moved excessively fast, damage or malfunction may occur. Accordingly, a planetary gear configured to decrease the speed of the motor 201 to ensure movement at a stable speed may be further provided. The planetary gear 202 serves to amplify or attenuate the number of revolutions of the motor 201 using a plurality of disc gears having different numbers of teeth. The motor 201 may be fixed to the first frame 101 as shown in FIG. 7(a). The position of the motor 201 is fixed even when the second frame 102 moves in the first direction to switch the mobile terminal 100 to the second state, as shown in FIG. 7(b).

Since the second frame 102 linearly moves with respect to the first frame 101 in the first direction or the second direction, rack and pinion gears configured to convert the rotational force of the motor 201 into linear motion may be used. A pinion gear to receive the rotational force of the motor 201 may be arranged to engage with a rack gear 205 composed of teeth continuously arranged in the first direction. The pinion gear may be fixed to the first frame 101 together with the motor 201 and the rack gear 205 may be positioned on the second frame 102. Alternatively, the rack gear 205 may be positioned on the first frame 101, and the motor 201 and the pinion gear may be arranged on the second frame 102. Since the motor 201 holds the pinion gear such that the pinion gear does not rotate, the second frame 102 may maintain the first state and the second state. However, when large external force is applied, the second frame 102 may be displaced as the pinion gear rotates.

A stopper (not shown) configured to fix the positions of the second frame 102 or the rack gear 205 and the first frame 101 may be further provided to fix the mobile terminal 100 in the first state or the second state. When electric current flows through the motor 201 to drive the motor 201, the stopper may be released to allow the movement of the second frame 102. When power is not applied to the motor 201 and thus the motor 201 does not rotate, the first frame 101 and the second frame 102 may be fastened such that the positions thereof are fixed.

When a pair of driving units 200 is symmetrically disposed in the vertical direction (the third direction), stable movement may be made. However, to arrange a battery or the like, the driving unit 200 should be arranged biased to one side in consideration of the limited mounting space of the mobile terminal 100 as shown in FIG. 7(a). According to such asymmetric arrangement of the driving unit 200, the second frame 102 may be distorted during movement due to a difference in movement speed between the upper end portion and the lower end portion. To address this issue, a linear guide 230 may be further provided.

The linear guide 230 may be disposed at both ends of the mobile terminal 100 facing in the third direction, that is, on the upper and lower sides of the mobile terminal 100, in order to supplement the function of one driving unit 200 biased to one side in the third direction. The linear guide 230 may include a guide rail 231 extending in the first direction and a guide block 232 configured to move along the guide rail 231. The guide rail 231 may be disposed on the first frame 101 and the guide block 232 may be disposed on the second frame 102, or vice versa. In this embodiment, the guide rail 231 may be disposed on the second frame 102 to cover the upper and lower sides of the extended portion of the second frame 102 in the second state.

After the guide block 232 is coupled to the first frame 101 and the guide rail 231 is coupled to the second frame 102, the guide block 232 and the guide rail 231 may be slidably fastened to each other. However, for convenience of the fastening, the guide block 232 and the guide rail 231 fastened to each other. Then, the guide block 232 may be first fixed to the first frame 101, and then the second frame 102 may be coupled to the guide rail 231.

The guide block 232 may be provided with a guide groove into which the guide rail 231 is inserted. Alternatively, the guide rail 231 may be provided with a rail groove into which a portion of the guide block 232 is inserted. The fastening portions of the guide rail 231 and the guide block 232 may be formed to be bumpy. Accordingly, movement in the first direction or the second direction may be made without displacement in the thickness direction of the mobile terminal 100. In order to reduce friction between the guide block 232 and the guide rail 231, a self-lubricating member having high wear resistance and low friction resistance, such as a bearing or polyoxymethylene (POM), may be added to the inside of the guide groove.

FIG. 8 is a cross-sectional view taken along lines A-A and B-B in FIG. 2. As illustrated in FIG. 2, when the second frame 102 switches to the second state by moving in the first direction, the third region 151c positioned on the rear side moves to the front, and thus a structure to support the rear surface of the third region 151c moved to the front is required. The second front portion 1021 positioned on the front surface of the second frame 102 may be positioned on the rear surface of the third region 151c in the second state. However, in the first state, the second front portion 1021 is disposed to overlap the first front portion 1011 of the first frame 101, and accordingly the first front portion 1011 and the second front portion 1021 form a step. A boundary is formed between the first region 151a and the third region 151c of the flexible display unit 151 by the step formed by the first front portion 1011 and the second front portion 1021. A rolling plate 104 may be used as a support structure to fill the gap between the second front portion 1021 and the third region 151c of the flexible display unit 151.

The rolling plate 104 may be positioned on the rear surface of the flexible display unit 151, and have a thickness corresponding to the gap between the second front portion 1021 and the flexible display unit 151 in the second state. As shown in FIG. 8(a), in the first state, the rolling plate 104 is rolled around the roller 210 and is positioned on the lateral side and rear side of the mobile terminal 100. The flexible display unit 151 and the rolling plate 104 may be positioned between the second rear portion of the second frame 102 and a rear cover 1025 provided to cover the rear face of the display unit 151. As shown in FIG. 8(b), when switch to the second state occurs, the rolling plate 104 may move to the front and the rolling plate 104 may be positioned on the front portion of the second frame 102.

The third region 151c of the display unit 151 in which the rolling plate 104 is positioned is a portion where bending deformation occurs when switch from the first state to the second state occurs. Accordingly, the rolling plate 104 may be deformed according to deformation of the third region 151c. Here, the rolling plate 104 is required to have a predetermined stiffness to maintain the flat state when the flexible display unit 151 is positioned on the front or rear of the mobile terminal. That is, the rolling plate 104 needs a structure capable of maintaining the flat state in the third direction and performing bending deformation in the first direction.

Figure 9:
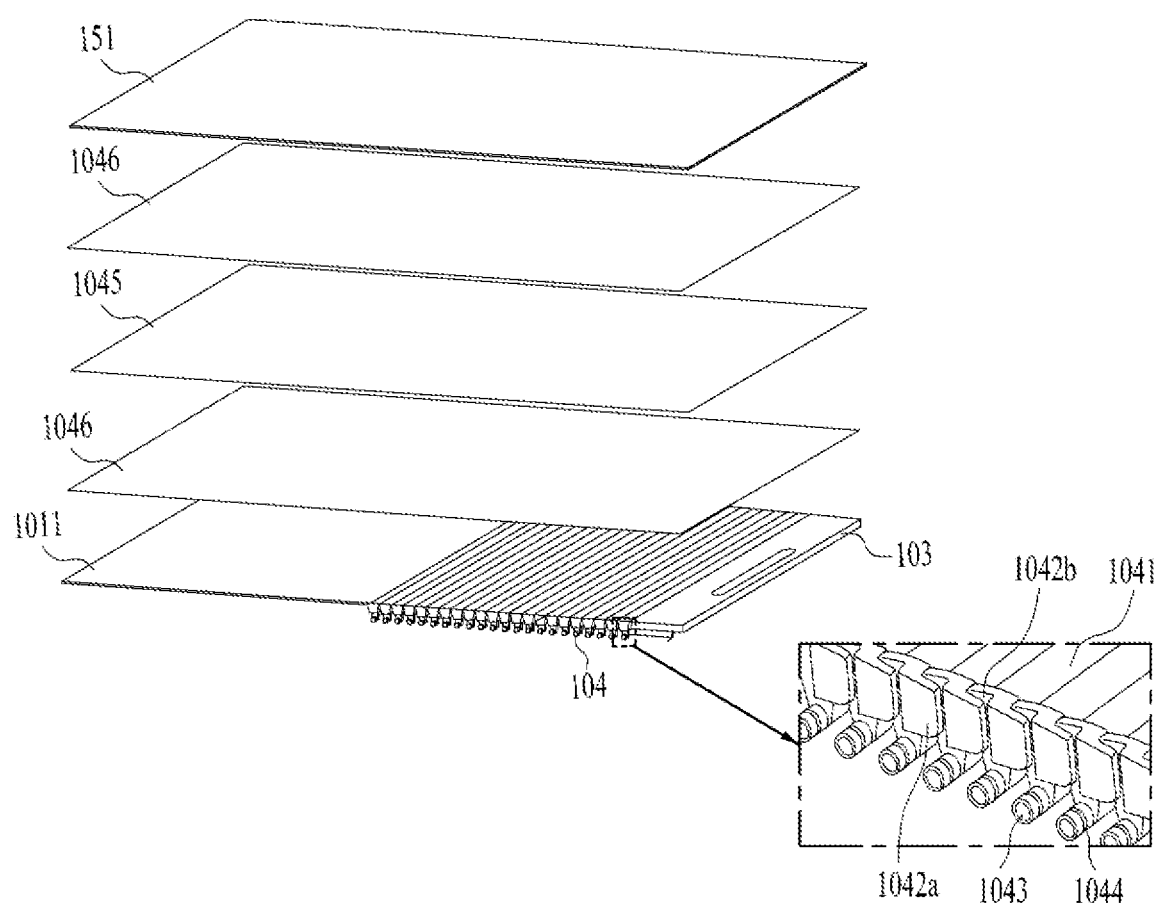
FIG. 9 is a view illustrating a display unit and a rolling plate of the mobile terminal in accordance with an embodiment.

FIG. 9 is a view illustrating a display unit 151 and a rolling plate 104 of the mobile terminal 100 in accordance with an embodiment. The rolling plate 104 may include multiple support bars 1041 extending in the third direction. The multiple support bars 1041 may be arranged side by side in the first direction and spaced apart from each other by a predetermined distance. Accordingly, even when the flexible display unit 151 is rolled around the roller 210 and is thus bent, interference between the support bars 1041 may be avoided. The support bars 1041 may be implemented with an injection molding material having a predetermined thickness for stiffness, and may include materials such as SUS or ferrosilicon (FeSi).

The multiple support bars 1041 may be directly attached to the rear surface of the display unit 151. However, this operation may take a long time and produce a lot of defects, resulting in poor productivity. In addition, directly processing the display unit 151 is highly likely to damage the display unit 151. Therefore, a rolling sheet 1045 to fix the multiple support bars 1041 may be further provided. The rolling sheet 1045 may include a metal material, and may employ a superelastic material that is bending-deformable and capable of recovering the flat state after the bending deformation. For example, a superelastic metal sheet such as a thin STS sheet of 0.05 mm or less may be used. An adhesive tape may be attached to both surfaces of the rolling sheet 1045 to bond the rolling sheet 1045 to the support bars 1041 and bond the rear surface of the display unit 151 to the rolling sheet 1045.

The rolling sheet 1045 may be provided with a kerf pattern in which multiple grooves extending in the third direction are formed in the first direction. The grooves in the kerf pattern may be formed between the multiple support bars 1041. The grooves may be formed on a surface of the rolling sheet 1045 to which the support bars 1041 are bonded. The kerf pattern may be formed in a wedge shape that is formed by being gradually narrowed from the surface portion of the rolling sheet 1045.

Instead of the rolling sheet 1045, an elastic material such as silicone may be disposed between the support bars 1041 to join neighboring support bars 1041. In this case, the angle between the support bars 1041 may be varied. The elastic connector may be bent at a position corresponding to the roller 210. When positioned on the front or rear of the mobile terminal, the elastic connector may be unfolded such that the support bars 1041 are disposed forming a flat surface.

The support bars 1041 may form a flat surface corresponding to the rear surface of the display unit 151. Alternatively, as shown in FIG. 8(b), the support bars 1041 may be formed in a shape having a predetermined curvature. The curved support bars 1041 may closely contact the curved surface of the roller 210 when the rolling plate 104 is rolled around the roller 210. Alternatively, one surface of the support bars 1041 in contact with the display unit 151 maintains a flat state, and the other surface thereof on the opposite side may include a curved surface corresponding to the curvature of the roller 210. In this case, the support bars 1041 may be thick at the ends thereof facing in the first and second directions and have the thinnest portion in the middle thereof.

The rolling plate 104 may be disposed at a position corresponding to the third region 151c and is rolled and bent around the roller 210. Thus, the rolling plate 104 may span over the front and rear surfaces. The rolling plate 104 is connected to the first front portion 1011 of the first frame 101 on the front side and connected to the slide frame 103 on the rear side. In order for the flexible display unit 151 to form a continuous surface without a step, the first front portion 1011 of the first frame 101 positioned on the rear surface of the first region 151a, the slide frame 103 positioned on the rear surface of the second region 151b, and the rolling plate 104 positioned on the rear surface of the third region 151c may be arranged such that the surfaces thereof in contact with the display unit 151 are at the same height. In particular, since the slide frame 103 moves on the rear of the mobile terminal 100 and moves in the same space as the rolling plate 104, the rolling plate 104 may have a thickness corresponding to the thickness of the slide frame 103.

FIG. 10 is a view illustrating an issue raised in an extendable mobile terminal 100. The figure shows the end of the second frame 102 in the third direction when the second frame 102 is extended as switching from the first state to the second state occurs. Since the display unit 151 contains a flexible material, the display unit 151 may be bent at a position corresponding to the roller 210. However, when the display unit 151 is positioned on the front of the mobile terminal 100 in the second state, it should be maintained in a flat state. Since the rolling plate 104 is not fixed to the second frame 102, the display unit 151 may sag downward as shown in FIG. 10(a) or rise upward as shown in FIG. 10(b).

The sagging issue of the display unit 151 (in FIG. 10(a)) may be addressed when the support bars 1041 of the rolling plate 104 described above support the rear surface of the third region 151c of the display unit 151 and the front portion of the second frame 102 supports the support bars 1041. However, in order to address an issue that the display unit 151 moved to the front is not arranged flat but is separated from the second frame 102 as shown in FIG. 10(b), the rolling plate 104 and the second frame 102 may further include a slide structure 1043, 1027. The slide structures 1043 and 1027 may fasten the rolling plate 104 (the display unit 151) so as not to be separated from the second frame 102 in the thickness direction of the mobile terminal 100 while allowing the movement thereof only in the first direction or the second direction.

Figure 11:
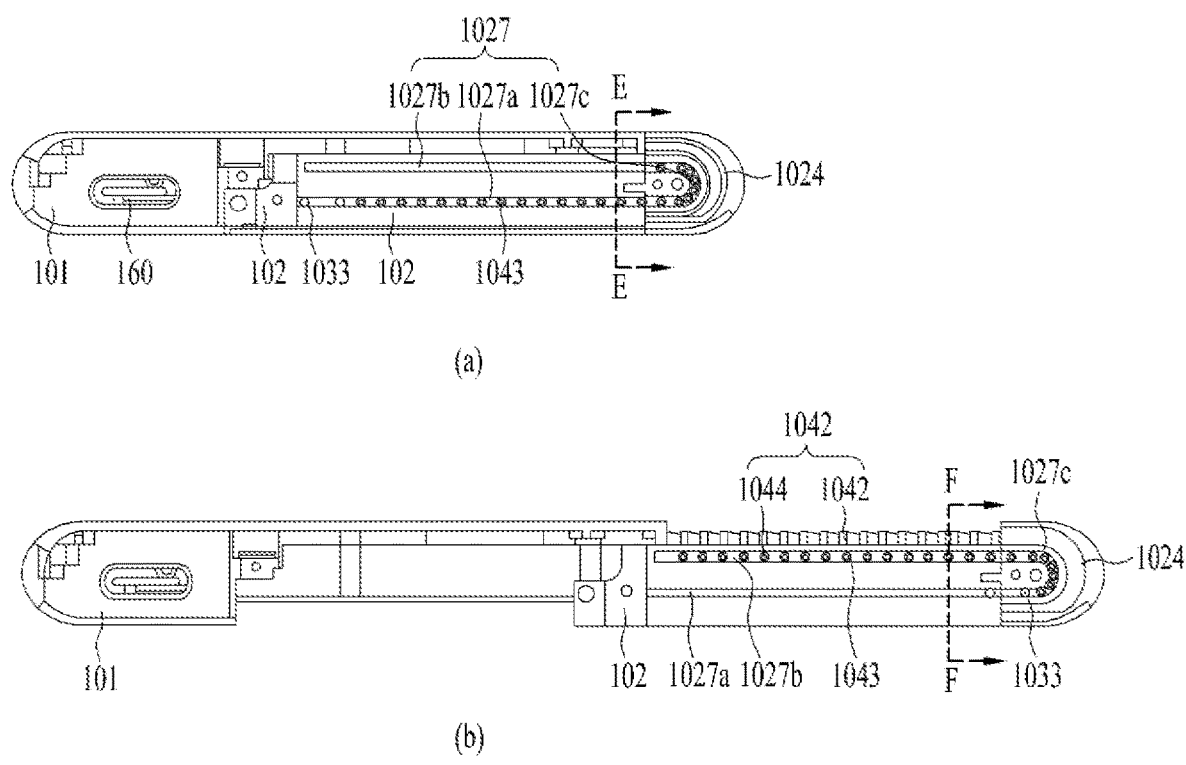
FIG. 11 is a cross-sectional view taken along lines C-C and D-D in FIG. 2.

FIGS. 11 to 13 are views showing the slide structures 1043 and 1027 provided on the rolling plate 104 and the second frame 102. FIG. 11 is a cross-sectional view taken along lines C-C and D-D in FIG. 2, FIG. 12 is a cross-sectional view taken along lines E-E and F-F in FIG. 11, and FIG. 13 is a view showing an expanded side portion 1042 and a guide hook 1043 of the mobile terminal 100 in accordance with an embodiment.

As shown in FIG. 13, the rolling plate 104 may include a slide hook 1043 protruding toward the second side portion 1023 positioned on the side of the second frame 102 facing in the third direction. As shown in FIG. 11, the second side portion 1023 of the second frame 102 may include a slide rail 1027 into which the slide hook 1043 is movably inserted. FIG. 11 shows the slide rail 1027 formed on the second side portion 1023 of the second frame 102. The slide rail 1027 may include a pair of horizontal portions 1027a and 1027b arranged side by side in a thickness direction and a curved portion 1027c connecting ends of the horizontal portions 1027a and 1027b facing in the first direction. The pair of horizontal portions 1027a and 1027b and the curved portion 1027c may form a U shape, and the slide hook 1043 may move along the slide rail 1027.

In the first state, the slide hook 1043 may be positioned in the horizontal portion 1027a, 1027b positioned on the rear side, as shown in FIG. 11 (a). In the second state, the slide hook 1043 may be moved to the horizontal portion 1027a, 1027b positioned on the front side, as shown in FIG. 11 (b). When moved from the rear horizontal portion 1027a to the front horizontal portion 1027b, the slide hook 1043 may pass through the curved portion 1027c. When the slide hooks 1043 pass through the curved portion 1027c, the rolling plate 104 may be bent and the space between the slide hooks 1043 may be narrowed.

The slide rail 1027 along which the slide hook 1043 moves may guide the movement of the slide hook 1043 and the movement of the slide frame 103 simultaneously. Since the slide frame 103 is also disposed adjacent to the support bars, a slide hook 1033 protruding from the slide frame 103 may be further provided.

FIG. 12(a) shows the second frame 102 in the first state in which the first frame 101 and the second frame 102 overlap each other, and FIG. 12(b) shows the second frame 102 moved from the first frame 101 in the first direction in the second state. As shown in FIG. 12(a), the support bars 1041 and the slide hooks 1043 are positioned on the rear in the first state. In the second state, as shown in FIG. 12(b), the support bars 1041 and the slide hooks 1043 are positioned on the front. The distance from the front face of the display unit 151 to the front horizontal portions 1027a and 1027b may be equal to the distance from the rear face of the display unit 151 to the rear horizontal portions 1027a and 1027b.

When large friction occurs during movement of the slide hooks 1043 along the slide rail 1027, a large load may be applied to the driving unit 200, thereby generating frictional noise or affecting the durability of the product. A self-lubricating member having high abrasion resistance and low friction resistance, such as polyoxymethylene (POM), may be used to facilitate the movement of the slide hooks 1043 on the slide rail 1027. By forming the slide hooks 1043 in a cylindrical shape, the area thereof in contact with the slide rail 1027 may be minimized.

As illustrated in FIG. 13, a slide roller 1044 fitted onto the slide hook 1043 may be further provided. The slide roller 1044 may be fitted onto the cylindrical slide hook 1043 to rotate about an axis extending in a direction in which the slide hook 1043 protrudes. The slide roller 1044 may rotate when the slide hook 1043 moves along the slide rail 1027, thereby reducing friction generated between the slide roller 1044 and the slide rail 1027.

A bearing structure may help to reduce the friction, but it may increase the overall size. For this reason, a simple ring-shaped slide roller 1044 may be used. A fastening groove 1043a and a fastening protrusion 1044a may be further provided to prevent the slide roller 1044 from being separated from the slide hook 1043. When the fastening protrusion 1044a is inserted into the fastening groove 1043a, the fastening groove 1043a formed on the outer circumferential surface of the slide hook 1043 in a ring shape and the ring-shaped fastening protrusion 1044a protruding from the inner surface of the slide roller 1044 are fastened to each other.

The second side portion 1023 of the second frame 102 is disposed overlapping the first side portion 1013 of the first frame 101 in the first state, and is exposed to the outside in the second state. Since the second side portion 1023 is positioned inside the first side portion 1013 of the first frame 101 in the first state, it may be difficult to connect the interface unit 160, the user input unit 123, the audio output unit 152, the antenna, and the like, which are positioned on the first side portion 1013, to the printed circuit board 181, which is positioned inside.

The second side portion 1023 may include an opening 1023a formed by omitting at least a part of the second side portion 1023 to connect the components positioned on the first side portion 1013 to the printed circuit board 181 positioned inside the first frame 101. Through the opening 1023a, a connector may be arranged between the components positioned on the first side portion 1013 and the printed circuit board. The opening 1023a may have a shape elongated in the first direction to prevent interference between the connector and the second side portion 1023 of the second frame 102 even when the second frame 102 is moved.

However, in order to prevent the inside of the mobile terminal 100 from being exposed through the opening 1023a in the second state, an expanded side portion 1042 may be formed at an end of the support bar 1041 to cover the opening 1023a in the second state. The expanded side portion 1042 may have a larger area than the cross section of the support bar 1041 at the end of the support bar 1041. The slide hook 1043 may be formed on a first expanded side portion 1042a extending in a direction away from the display unit 151. When the slide hook 1043 is disposed parallel to the support bar 1041, the second side portion 1023 of the second frame 102 should be extended adjacent to the display unit 151, which may make it difficult to form the opening 1023a. Accordingly, the slide hooks 1043 may be formed at positions spaced apart from the display unit 151 by a predetermined distance. The first expanded side portion 1042a may be formed in a fan shape to have a width that is reduced as the first expanded side portion 1042a extends in a direction away from the display unit 151. FIG. 13 is a view showing an embodiment of the rolling plate 104 of the mobile terminal 100. Since the rolling plates at positions on the curved portion 1027c of the slide rail 1027 spaced apart from the display portion 151 are disposed adjacent to each other, the first expanded side portion 1042a may be formed in a fan shape to prevent the rolling plates from overlapping each other.

The expanded side portion 1042 may also extend in the left-right direction, and may thus cover a space between neighboring support bars 1041. The expanded side portion 1042 may further include a second expanded side portion 1042b forming a step with respect to the first expanded side portion 1042a as shown in FIG. 13. The second extension side portion 1042b may be disposed to overlap the first expanded side portion 1042a adjacent thereto to cover the space between the support bars 1041. The second expanded side portion 1042b may have a size corresponding to the thickness-wise size of the opening 1023a formed in the second side portion 1023 of the second frame 102. The second expanded side portion 1042b may be formed to be shorter than the first expanded side portion 1042a on the side spaced apart from the display unit 151. The second expanded side portion 1042b may be formed to be shorter than the first expanded side portion 1042a to prevent the second expanded side portions 1042b from overlapping each other when the rolling plates pass through the curved portion 1027c of the slide rail 1027. The second expanded side portion 1042b may be formed to have a size corresponding to the size of the opening 1023a to cover the space between the first expanded side portions 1042a to prevent the inside of the second frame 102 from being exposed to the outside.

As shown in FIG. 14, the second expanded side portion 1042b may have any shape as long as the shape ensures that the second expanded side portions 1042b do not interfere with each other, and allows the second expanded side portion 1042b to cover the space between the first expanded side portions 1042a and to cover the opening 1023a of the second side portion 1023 of the frame 102. It may have a rectangular shape as shown in FIG. 14(a) or a semicircular shape as shown in FIG. 14(b).

FIG. 15 is a view illustrating distortion and shaking of the first frame 101 and the second frame 102 of the mobile terminal 100. As shown in FIG. 15(a), the first frame 101 and the second frame 102 may be distorted in the longitudinal direction (vertical direction) of the mobile terminal 100 and during slide movement thereof. Such distortion may wrinkle the display unit 151 or cause damage to the slide structure.

As shown in FIG. 15(b), the first frame 101 and the second frame 102 need to be spaced apart from each other by a predetermined distance for slide movement. If they closely contact each other, friction may increase, thereby obstructing slide movement. Accordingly, the frames may be spaced apart from each other by a gap of about 0.15 mm. However, this gap may cause distortion as shown in FIG. 15(a). Accordingly, a member that may allow horizontal movement of the second frame 102 without shaking while maintaining the gap is needed.

FIG. 16 is a view showing a rolling ball 1029 employed to address the issue illustrated in FIG. 15. As shown in FIG.

16(a), the rolling ball 1029 is inserted into a concave insertion portion formed in the second side portion 1023 of the second frame 102. The rolling ball 1029 may be in contact with the first frame 101 on one side and may rotate within the insertion portion of the second side portion when the second frame 102 moves in the first direction. When the rolling ball 1029 is rotatably inserted, the rolling ball 1029 may be displaced in the assembly process because the second frame 102 has no structure to fix the rolling ball 1029. To address this issue, as shown in FIG. 16(b), a magnet 1029' may be placed inside the insertion portion, and the rolling ball 1029 may be made of a magnetic material. Thereby, the rolling ball 1029 may be prevented from being displaced from the insertion portion when the first frame 101 and the second frame 102 are connected.

The rolling ball 1029 may protrude as far as the gap between the first frame 101 and the second frame 102 to contact the first frame 101. Thereby, the second frame 102 may be prevented from being distorted due to the gap. In addition, since the second frame 102 is spaced apart from the first frame 101 by a predetermined distance rather than directly contacting the first frame 101 and the rolling ball 1029 rotates during movement of the second frame 102, friction generated when the mobile terminal switches between the states may be minimized.

As described above, the mobile terminal of the present disclosure may allow the size of the screen to be adjusted as needed, thereby satisfying both portability and usability.

In addition, the mobile terminal of the present disclosure may reduce the damage caused by a concentrated stress on the display unit because the stress is not concentrated at a specific point.

In addition, the display unit may be maintained in a flat state by preventing the display unit from being separated during movement of the second frame.

Further, as a structure to guide the second frame and the slide frame 103 to move in parallel is provided, distortion may be prevented.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A mobile terminal comprising:
a first frame;
a second frame configured to slidably move from the first frame in a first direction and a second direction, the second direction being opposite to the first direction;
a metal rolling ball inserted into a side portion of the second frame, and
a magnet provided in an insertion portion of the second frame to apply magnetic force to the rolling ball, the rolling ball being inserted into the second frame,
a flexible display comprising a fixed portion coupled to the first frame, and a variable portion bent in a manner of surrounding the second frame; and
a rolling plate attached to a rear surface of the variable portion of the flexible display,
wherein the second frame comprises:
the side portion positioned at an end thereof facing in a third direction perpendicular to the first direction; and
a slide rail formed on the side portion,
wherein the rolling plate comprises:
a plurality of support bars extending in the third direction perpendicular to the first direction and arranged side by side in the first direction; and
a slide hook protruding at an end of each of the support bars, and inserted into the slide rail to move along the slide rail,
wherein, when the second frame is moved in the first direction or the second direction, the rolling ball rotates in contact with the first frame.

2. The mobile terminal of claim 1, wherein the slide hook has a cylindrical shape.

3. The mobile terminal of claim 2, further comprising a ring-shaped slide roller, the slide roller being inserted into the slide hook.

4. The mobile terminal of claim 3, further comprising:
a fastening groove formed in a ring shape on an outer circumferential surface of the slide hook; and
a fastening protrusion protruding from an inner surface of the slide roller and inserted into the fastening groove.

5. The mobile terminal of claim 1, further comprising
a first expanded side portion extending from the end of each of the support bars to a position spaced apart from the flexible display,
wherein the slide hook formed at an end of the first expanded side portion, and
wherein a width of the first expanded side portion in the first direction is narrowed as the first expanded side portion extends away from the flexible display.

6. The mobile terminal of claim 5, wherein the rolling plate further comprises:
a second expanded side portion forming a step with respect to the first expanded side portion,
wherein the second expanded side portion is disposed to overlap the first expanded side portion of a neighboring support bar among the support bars.

7. The mobile terminal of claim 6, wherein the side portion of the second frame comprises an opening positioned on a front side,
wherein a width of the opening corresponds to a size of the second expanded side portion.

8. The mobile terminal of claim 7, wherein the opening extends in the first direction,
the mobile terminal further comprising:
a connector arranged through the opening to connect a side portion of the first frame to a printed circuit board positioned inside the first frame.

9. The mobile terminal of claim 1, further comprising:
a roller coupled to the second frame to be rotatable about a rotation axis extending in the third direction perpendicular to the first direction,
wherein the variable portion is bent in a manner of surrounding the roller,
wherein each of the support bars comprises a curved surface corresponding to a curvature of the roller.

10. The mobile terminal of claim 1, wherein the slide rail comprises:
a first horizontal portion positioned adjacent to a rear of the second frame;
a second horizontal portion positioned in front of the second frame and arranged parallel to the first horizontal portion; and
a curved portion connecting ends of the first horizontal portion and the second horizontal portion facing in the first direction.

11. The mobile terminal of claim 10, wherein the side portion of the second frame comprises an opening positioned on a front side of the first horizontal portion,
wherein, when the second frame is moved in the first direction to switch from a first state to a second state, an end of the rolling plate facing in the third direction is exposed to an outside through the opening.

12. The mobile terminal of claim 1, wherein the rolling plate further comprises:
a rolling sheet having one surface coupled to the flexible display and an opposite surface coupled to the support bars.

13. The mobile terminal of claim 12, wherein the rolling sheet comprises a superelastic metal sheet.

14. The mobile terminal of claim 12, wherein the rolling sheet comprises a kerf pattern provided with a plurality of grooves extending in the third direction and arranged in the first direction.

15. The mobile terminal of claim 14, wherein the grooves are positioned between the support bars.

16. The mobile terminal of claim 14, further comprising:
an adhesive tape positioned between the rolling sheet and the support bars and between the rolling sheet and the display.

17. The mobile terminal of claim 1, further comprising:
a flexible connector configured to connect the support bars.

* * * * *